(12) United States Patent
Matsuda

(10) Patent No.: US 6,314,273 B1
(45) Date of Patent: Nov. 6, 2001

(54) MOBILE TELECOMMUNICATION APPARATUS HAVING NOTCHES

(75) Inventor: Terukazu Matsuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/135,581

(22) Filed: Aug. 18, 1998

(30) Foreign Application Priority Data

Sep. 11, 1997 (JP) .................................................. 9-246569

(51) Int. Cl.[7] ...................................................... H04B 1/38
(52) U.S. Cl. ............................. 455/90; 455/575; 455/550
(58) Field of Search .................................. 455/575, 550, 455/90, 114, 347, 300, 296, 327; 393/767, 715

(56) References Cited

U.S. PATENT DOCUMENTS

| 3,867,759 | * | 2/1975 | Siefker ............................ 29/830 |
| 4,152,671 | * | 5/1979 | Tuma et al. ..................... 428/423.4 |
| 5,181,043 | * | 1/1993 | Cooper ............................ 343/713 |
| 5,493,702 | * | 2/1996 | Crowley et al. ................ 455/575 |
| 5,517,676 | * | 5/1996 | Sekine et al. .................... 455/575 |
| 5,633,613 | * | 5/1997 | MacDonald ...................... 455/327 |
| 5,706,332 | * | 1/1998 | Nagai ............................... 455/550 |
| 5,903,822 | * | 5/1999 | Sekine et al. .................... 343/702 |
| 5,940,038 | * | 8/1999 | Brown ............................. 343/702 |
| 5,966,101 | * | 10/1999 | Haub et al. ...................... 343/767 |
| 5,999,831 | * | 12/1999 | Itoh ................................. 455/575 |
| 6,043,786 | * | 3/2000 | Vannatta et al. ................ 343/770 |

FOREIGN PATENT DOCUMENTS

| 1292885 | 11/1989 | (JP) . |
| 385925 | 4/1991 | (JP) . |
| 0774807 | 3/1995 | (JP) . |

* cited by examiner

*Primary Examiner*—Nay Maung
*Assistant Examiner*—Sonny Trinh

(57) ABSTRACT

A mobile telecommunication apparatus reduces current around a control circuit on a printed circuit board so as to lessen background noise and to improve the radiation characteristic. The mobile telecommunication apparatus includes a printed circuit board located in a body of the mobile telecommunication apparatus; a radio circuit including a modulator circuit and a demodulator circuit arranged on the printed circuit board; a control circuit including a voice circuit for processing a voice signal arranged on the printed circuit board; a first earth conductor for grounding the radio circuit; a second earth conductor for grounding the control circuit and being continuous with the first earth conductor; an antenna connected to the radio circuit; and a slit arranged between the first earth conductor and the second earth conductor.

23 Claims, 22 Drawing Sheets

MOBILE TELECOMMUNICATION APPARATUS HAVING NOTCHES

BACKGROUND OF THE INVENTION

1. Field of the Invention

The present invention relates to a mobile telecommunication apparatus such as a portable telephone and a PHS telephone.

2. Description of the Prior Art

FIG. 18 illustrates a conventional mobile telecommunication apparatus shown in Japanese Laid-Open Patent Publication No. 7-74807, "A Portable Telephone". FIG. 18 includes a body 1 of a telecommunication apparatus, an antenna 2, a transmitter 3, and a receiver 4.

FIG. 19 is a perspective view which illustrates an internal construction of a conventional mobile telecommunication apparatus. FIG. 20 and FIG. 21 are sectional views seen from a line A–B and a line C–D in FIG. 19, respectively.

In FIG. 19–FIG. 21, the mobile telecommunication apparatus includes a printed circuit board 5, a radio circuit 6 formed on the printed circuit board 5, a control circuit 7 formed on the printed circuit board 5, a voice circuit 8, shield cases 9a and 9b surrounding the radio circuit 6, a feeder line 10, a feeding circuit 11, an earth conductor 12 for the radio circuit 6, an earth conductor 13 for the control circuit, an earth conductor 14 formed between the earth conductors 12 and 13, and a battery 15.

The printed circuit board 5 is actually a multi-layered circuit board. Parts constructing the radio circuit 6 and the control circuit 7 are mounted on the printed circuit board 5. The voice circuit 8 is included in the control circuit 7.

The shield cases 9a and 9b are equipped to shield external noise coming into the radio circuit 6 and to prevent the escape of radiation to the outside. However, since the shield construction around the control circuit 7 is complicated, the shield construction is not generally included.

The antenna 2 generally uses a λ/4 monopole antenna (λ indicates a wavelength of the frequency being used) or a λ/2 monopole antenna. Impedance of a λ/4 monopole antenna is easily matched and the structure of the feeding circuit 11 is relatively simple. The radiation characteristic of the λ/2 monopole antenna is better than the λ/4 monopole antenna although the construction of feeding circuit 11 becomes a little bit complicated due to impedance matching. The earth conductor 12, the earth conductor 13, and the earth conductor 14 are equipped on the printed circuit board 5. The earth conductor 14 is equipped between the earth conductor 12 and the earth conductor 13, and they are connected electrically.

The operation of the conventional mobile telecommunication apparatus is explained below. During transmitting, a human voice from a transmitter 3 is converted to a voice signal through the voice circuit 8 in the control circuit 7. The voice signal is modulated to a high frequency signal by the radio circuit 6. The modulated high frequency signal is radiated from the antenna 2 via the feeding circuit 11.

On the other hand, during receiving, a high frequency modulated signal which enters the radio circuit 6 via the feeding circuit 11 from the antenna 2 is demodulated to a voice signal through a demodulator circuit. The demodulated voice signal is transduced into an audible human voice by the receiver 4 via the voice circuit 8 in the control circuit 7. Also, the battery 15 supplies power to the radio circuit 6 and the control circuit 7.

FIG. 22 illustrates an example of a longitudinal current distribution on the side of the printed circuit board 5 facing the battery 15 in the conventional mobile telecommunication apparatus using a λ/4 monopole antenna as the antenna 2.

In FIG. 22, numerals 16 and 17 indicate current amplitude and phase which distribute along the antenna 2 and the radio circuit 6, respectively. Numerals 18 and 19 indicate current amplitude and phase which distribute along the control circuit 7, respectively.

Current flowing through the earth conductor 14 equipped between the radio circuit 6 and the control circuit 7 is amplified by a parallel plane mode oscillation between the battery 15 and the control circuit 7 that generates a sinewave current 18 having large amplitude.

This current having a sinewave distribution greatly influences the voice circuit 8 in the control circuit 7. This current generates noise in the voice signal which is then transduced by the receiver 4 thereby decreasing the speech quality.

Also, the phase 19 of the current flowing along the control circuit 7 on the printed circuit board 5 is contrary to the phase 17 of current distributing between the antenna 2 and the radio circuit 6. Therefore, the antenna gain of the telecommunication apparatus toward the horizontal direction is extremely attenuated, which decreases the available communication distance.

SUMMARY OF THE INVENTION

It is an object of the presentation to reduce current around the control circuit on the printed circuit board and to obtain a mobile telecommunication apparatus having less background noise and good antenna radiation characteristics.

According to an aspect of the invention, a mobile telecommunication apparatus includes a printed circuit board equipped in a body of the mobile telecommunication apparatus; a radio circuit including modulator circuit and a demodulator circuit arranged on the printed circuit board; a control circuit including a voice circuit for processing a voice signal arranged on the printed circuit board; a first earth conductor for grounding the radio circuit; a second earth conductor for grounding the control circuit and being continuous with the first earth conductor; an antenna connected to the radio circuit; and a slit arranged between the first earth conductor and the second earth conductor.

According to another aspect of the invention, a mobile telecommunication apparatus includes first and second printed circuit boards equipped in a mobile telecommunication apparatus; a radio circuit including a modulator circuit and a demodulator circuit arranged on the first printed circuit board; a control circuit including a voice circuit for processing a voice signal arranged on the second printed circuit board; a first earth conductor for grounding the radio circuit on the first printed circuit board; a second earth conductors for grounding the control circuit on the second printed circuit board; a third earth conductors on the second printed circuit board being electrically connected with the second earth conductor; a connector for connecting the first earth conductor with the third earth conductor; an antenna being connected to the radio circuit; and a slit arranged between the second earth conductor and the third earth conductor.

In one preferable alternative, the antenna of the mobile telecommunication apparatus is a slot inner antenna constructed by λ/4 wavelength slot arranged at one portion of the printed circuit board.

In another preferable alternative, the antenna of the mobile telecommunication apparatus is a λ/4 wavelength monopole antenna protruding toward outside of the apparatus body.

The inner antenna of the mobile telecommunication apparatus can also be a λ/2 monopole antenna protruding toward outside of the apparatus body which is excited from the inner antenna by way of non-contact feeding thereby providing a further alternative.

The slit is also preferably constructed by pattern etching process on the printed circuit board.

According to a further aspect of the invention, a mobile telecommunication apparatus includes a printed circuit board equipped in a body of the mobile telecommunication apparatus; a radio circuit including modulator circuit and a demodulator circuit arranged on the printed circuit board; a control circuit including a voice circuit for processing a voice signal arranged on the printed circuit board; a first earth conductor formed on a first surface of the printed circuit board for grounding the radio circuit; a second earth conductor formed on a second surface of the printed circuit board for grounding the control circuit; a third earth conductor located on the second surface of the printed circuit board at a corresponding location facing the first earth conductor and being electrically connected with the second earth conductor; a fourth earth conductor located on the first surface of the printed circuit board at a corresponding location facing the second earth conductor; a battery facing the fourth earth conductor; an antenna connected to the radio circuit; and a first slit for electrically separating the first earth conductor and the fourth earth conductor; and a second slit arranged between the second earth conductor and the third earth conductor.

According to a further aspect of the invention, a mobile telecommunication apparatus includes a printed circuit board equipped in a body of the mobile telecommunication apparatus; a radio circuit including modulator circuit and a demodulator circuit arranged on the printed circuit board; a control circuit including a voice circuit for processing a voice signal arranged on the printed circuit board; a first earth conductor formed on a first surface of the printed circuit board for grounding the radio circuit; a second earth conductor formed on a second surface of the printed circuit board for grounding the control circuit; a third earth conductor located on the second surface of the printed circuit board at a corresponding location facing the first earth conductor for grounding the radio circuit; a fourth earth conductor located on the first surface of the printed circuit board at a corresponding location facing the second earth conductor for grounding the control circuit; a battery being placed facing the fourth earth conductor; an antenna connected to the radio circuit; and a first slit for electrically separating the first earth conductor and the fourth earth conductor; and a second slit for electrically separating the second earth conductor and the third earth conductor.

According to a further aspect of the invention, a mobile telecommunication apparatus includes a multi layered printed circuit board equipped in a body of the mobile telecommunication apparatus, the multi layer includes a plurality of earth conductors and dielectric boards interleaved between the earth conductors; each of the earth conductors includes a first earth conductor for grounding a radio circuit and a second earth conductor for grounding the control circuit; a slit each for electrically separating the first earth conductor and the second earth conductor; a battery being placed facing the second earth conductors; and some of the first earth conductors on any of the surfaces of the dielectric boards are connected to the any second earth conductors on another surface of the dielectric boards through the earth conductor and the dielectric board.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications in the spirit and scope of the invention will become apparent to those skilled in the art from this detailed description.

Embodiment 1

Figure 1:
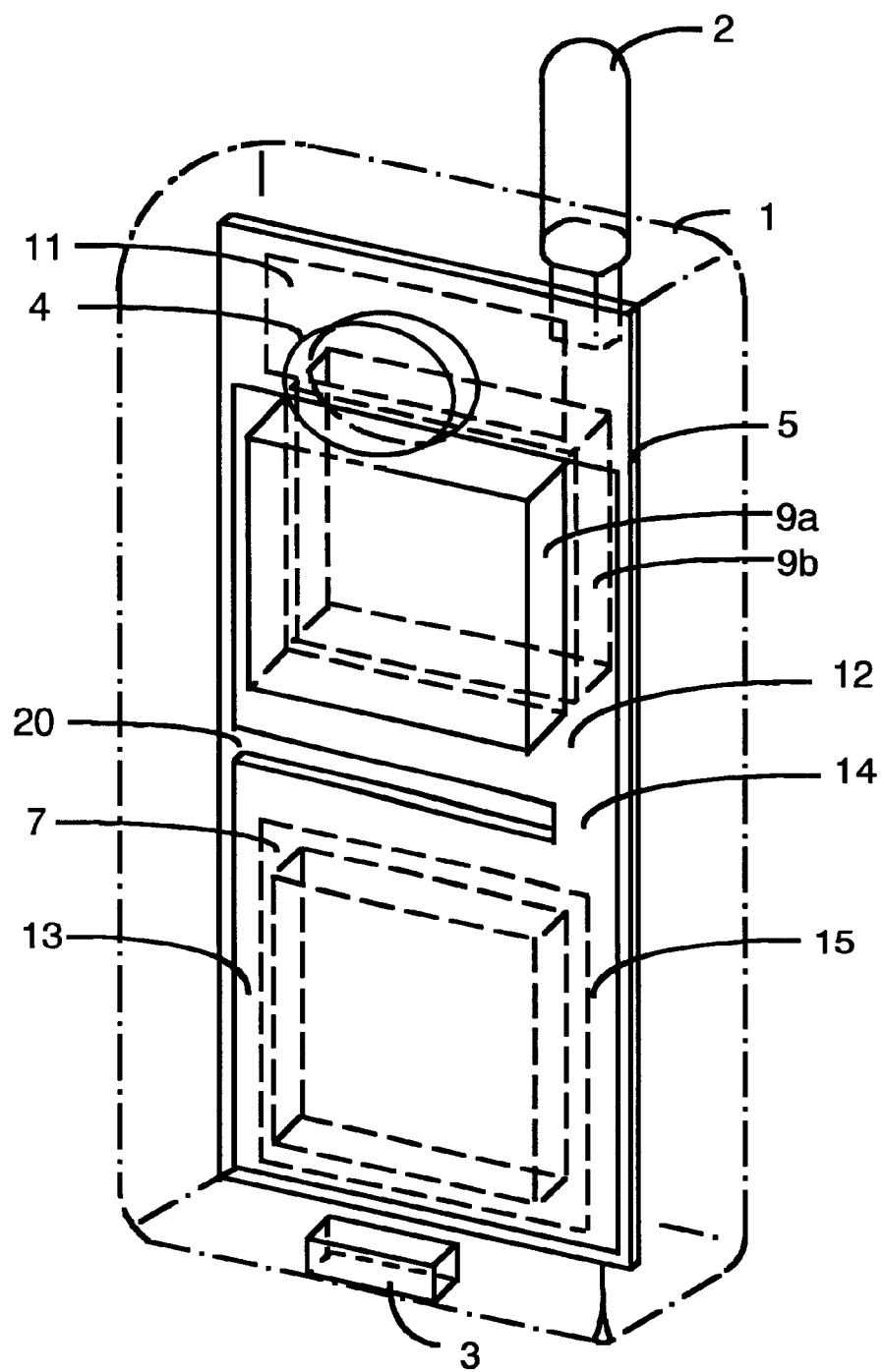
FIG. 1 is a perspective view which illustrates an internal construction of a mobile telecommunication apparatus of a first embodiment of the present invention.

A first embodiment of the present invention is explained below. FIG. 1 is a perspective view which illustrates an internal construction of a mobile telecommunication apparatus of a first embodiment of the present invention.

FIG. 1 includes a body 1 of a telecommunication apparatus, an antenna 2, a transmitter 3, a receiver 4, a printed circuit board 5, a radio circuit 6 formed in the printed circuit board 5, a control circuit 7 formed in the printed circuit board 5, a voice circuit 8, shield cases 9a and 9b surrounding the radio circuit 6, a feeder line 10, a is 5 feeding circuit 11, an earth conductor 12 for the radio circuit 6, an earth conductor 13 for the control circuit, an earth conductor 14 formed between the earth conductors 12 and 13, and a battery 15.

A slit 20 is notched between the radio circuit 6 and the control circuit 7 on the printed circuit board 5. The slit 20 forms a narrow earth conductor 14 which connects the earth conductor 12 and the earth conductor 13. The earth conductor 12 is referred to as a first earth conductor and the earth conductor 13 is referred to as a second earth conductor. The respective first earth conductors 12 and the second earth conductors 13 are part of the printed circuit board 5, and they are electrically connected via the earth conductor 14.

Figure 2:
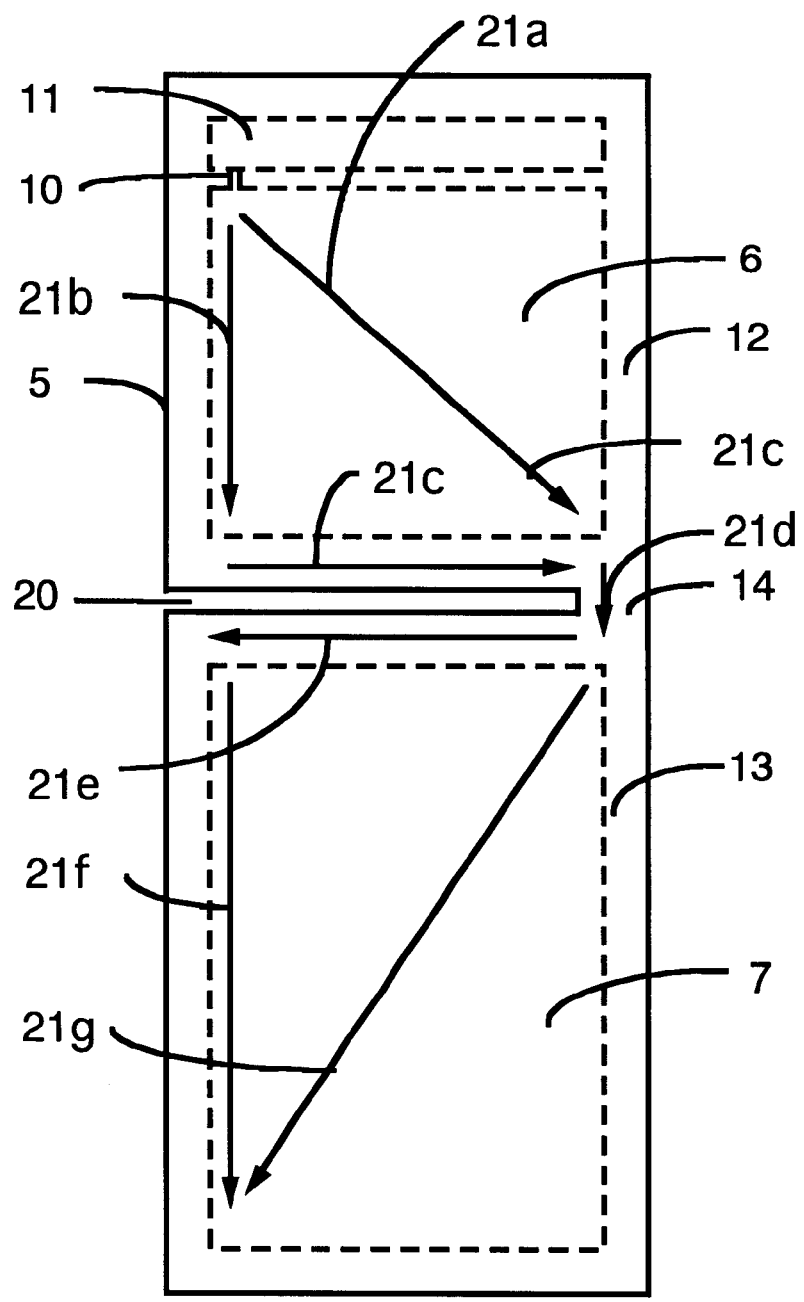
FIG. 2 is a diagram showing one example of the current on the printed circuit board of the first embodiment of the present invention.

FIG. 2 illustrates an example of currents flowing on the printed circuit board 5. In FIG. 2, arrows 21a–21g represent the directions of current flowing on the earth conductor of printed circuit board 5.

The current 21b longitudinally flowing on the earth conductor 12 of the printed circuit board 5 is prevented by the slit 20 and flows through along the slot 20 like the current 21c. Therefore, the current path along the slot 20 gets longer and the current flowing through the path along the slot 20 is more attenuated. Also, the current 21d longitudinally flowing along the earth conductor 14 of the printed circuit board 5 is suppressed because of narrower width of the earth conductor 14.

Figure 22:
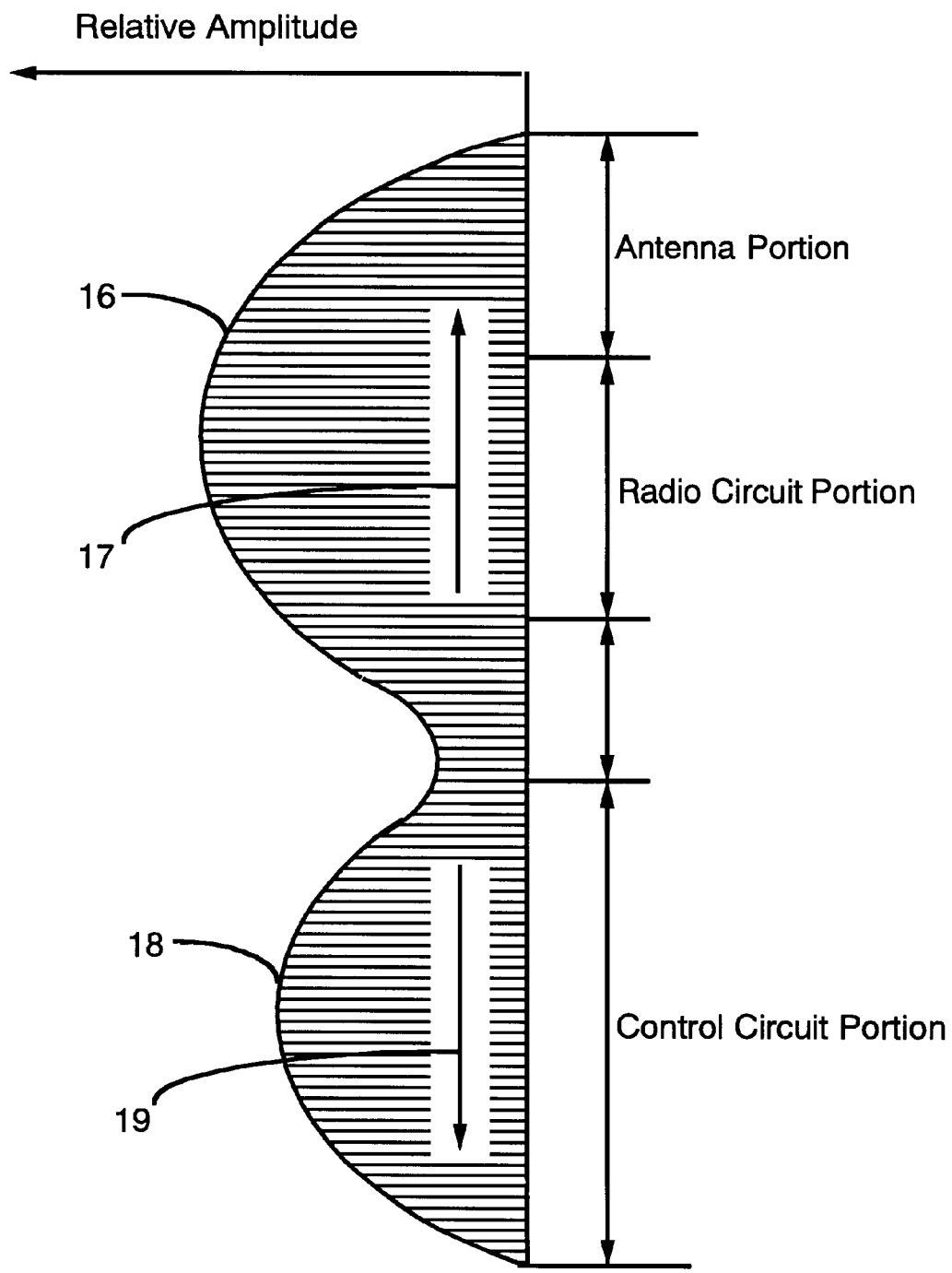
FIG. 22 illustrates an example of a longitudinal current distribution on the printed circuit board facing a battery in the conventional mobile telecommunication apparatus which uses a λ/4 monopole antenna.

Thus, the parallel plain board mode generated between the control circuit 7 and the battery 15 shown in FIG. 22 is suppressed, and the current 21c–21f around the control circuit 7 is reduced. That is, the current amplitude which distributes along the control circuit 7 is reduced.

The printed circuit board 5 can be a multi-layered circuit board which includes a single surface circuit board or a double surface circuit board, and the same current decreasing effect can be obtained regardless of the number of layers.

Embodiment 2

Figure 3:
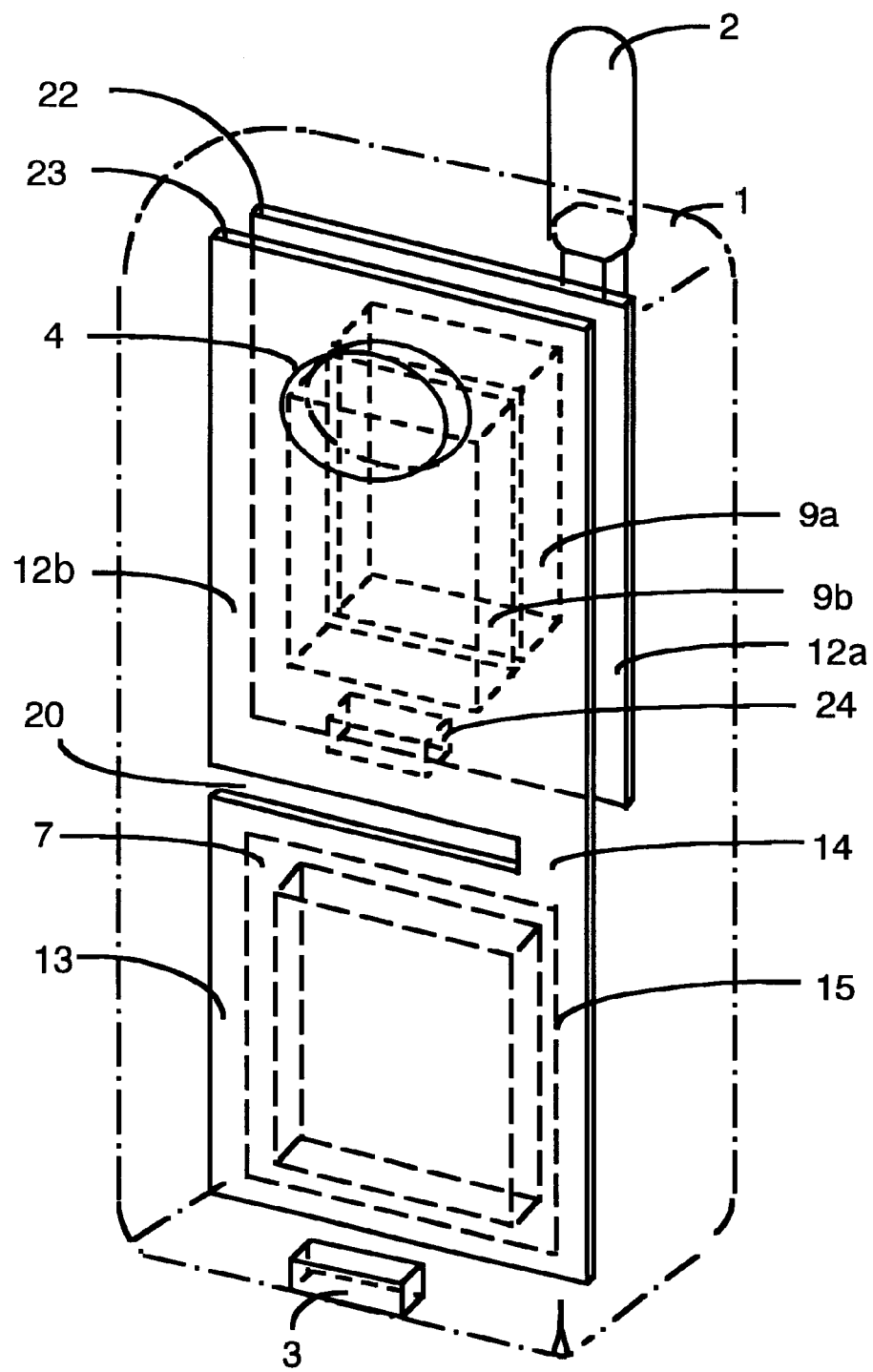
FIG. 3 is a perspective view which illustrates a mobile telecommunication apparatus of the second embodiment of the present invention.
Figure 4:
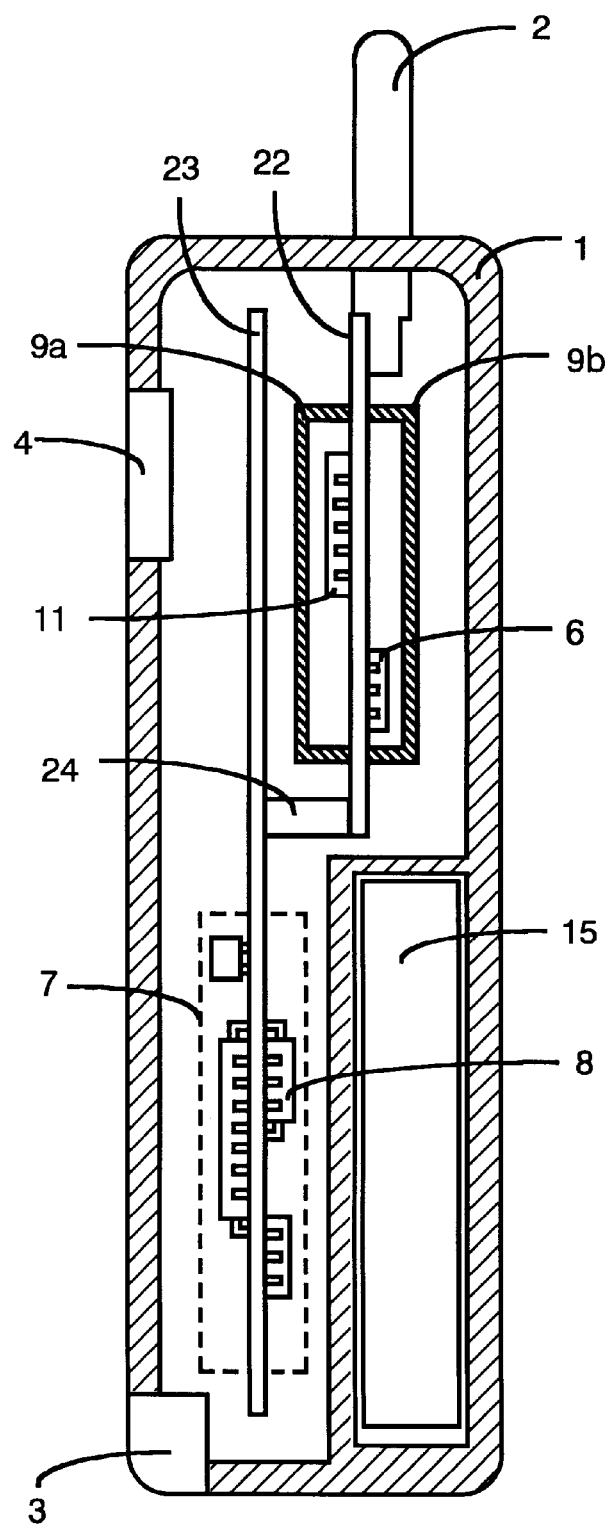
FIG. 4 is a side sectional diagram which illustrates a mobile telecommunication apparatus of the second embodiment of the present invention.

FIG. 3 shows a perspective view which illustrates a mobile telecommunication apparatus according to a second embodiment. FIG. 4 is a sectional diagram of the mobile telecommunication apparatus depicted in FIG. 3.

In FIG. 3 and FIG. 4, the mobile telecommunication apparatus includes a first printed circuit board 22 equipped with a radio circuit 6 and a feeding circuit 11, a second printed circuit board 23 is equipped with a control circuit 7, shield cases 9a and 9b surrounding the radio circuit 6 and a feeding circuit 11, and a connector for connecting the first printed circuit board 22 with the second printed circuit board 23. In this second embodiment, the antenna 2 is connected to the feeding circuit 11 on the edge of the first printed circuit board 22.

The slit 20 is arranged between the first earth conductor 12a where the radio circuit 6 is equipped and the second earth conductor 13 where the control circuit 7 is equipped. The lower portion of the third earth conductor 12b on the second printed circuit board 23 is connected to the first earth conductor 12a via the connector 24.

The slit 20 forms a narrow earth conductor 14 which connects the third earth conductor 12b and the second earth conductor 13. Other construction details of the second embodiment are the same as those of the first embodiment.

In the second embodiment, a parallel plain board mode occurring between the first printed circuit board 22 and the second printed circuit board 23 generates a sinusoidal current having a large amplitude. However, the current longitudinally flowing on the earth conductor 12b of the second printed circuit board 23 is prevented by the slit 20 and flows through along the slot 20 in the same way as explained in the first embodiment. Therefore, the current flowing from the earth conductor 12a on the first printed circuit board 22 to the earth conductor 13 on the second printed circuit board 23 via the connector 24 is suppressed because of the narrow width earth conductor 14.

Thus, the parallel plain board mode generated between the battery 15 and the second printed circuit board 23 is suppressed, and the current around the control circuit 7 is reduced. Also, the current between the first printed circuit board 22 and the second printed circuit board 23 due to the parallel plain board mode is suppressed. Accordingly, the current amplitude which distributes along the control circuit 7 is reduced.

The first printed circuit board 22 and the second printed circuit board 23 can be multi-layered circuit boards which include a single surface circuit board or a double surface circuit board, respectively, and the same current decreasing effect can be obtained regardless of the number of layers.

Embodiment 3

Figure 5:
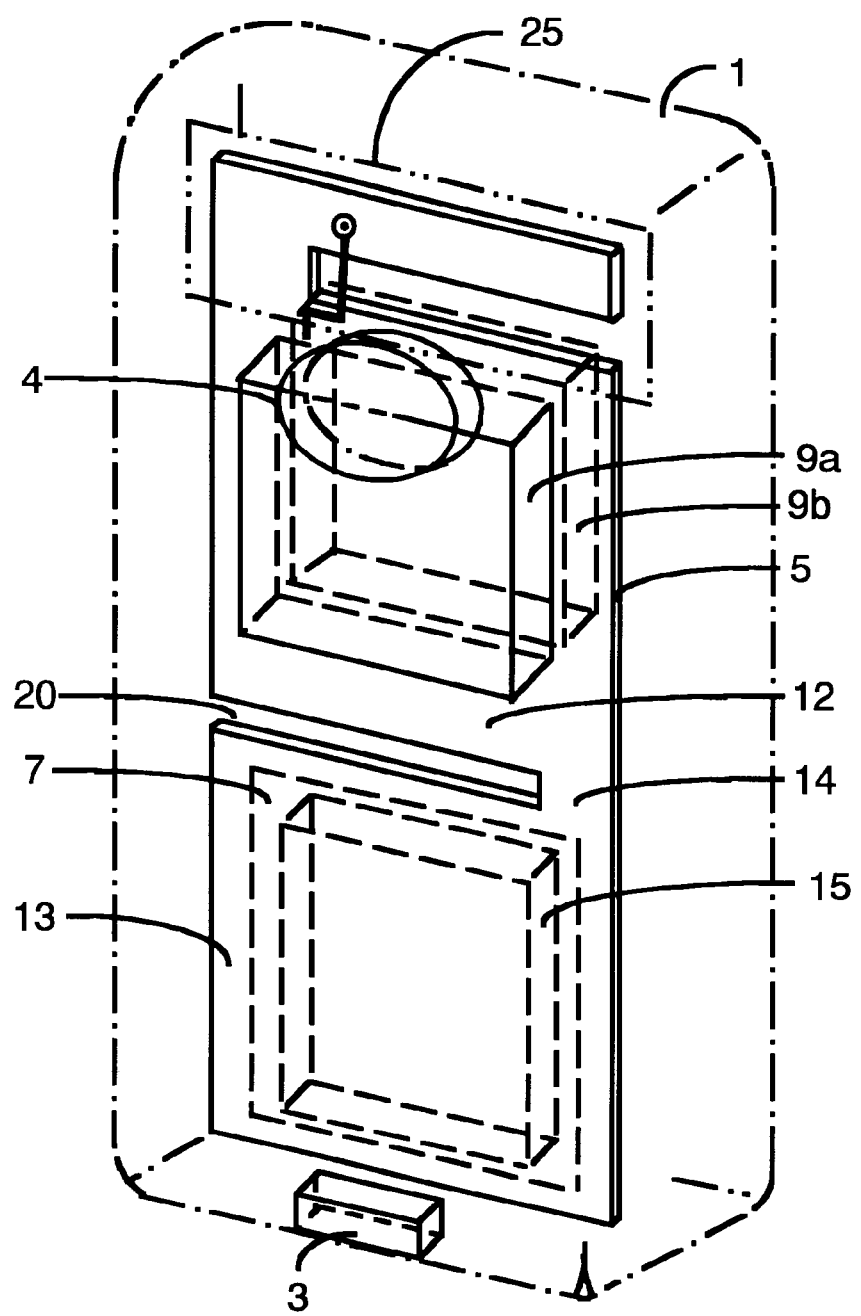
FIG. 5 is a perspective view which illustrates a mobile telecommunication apparatus of the third embodiment of the present invention.
Figure 6:
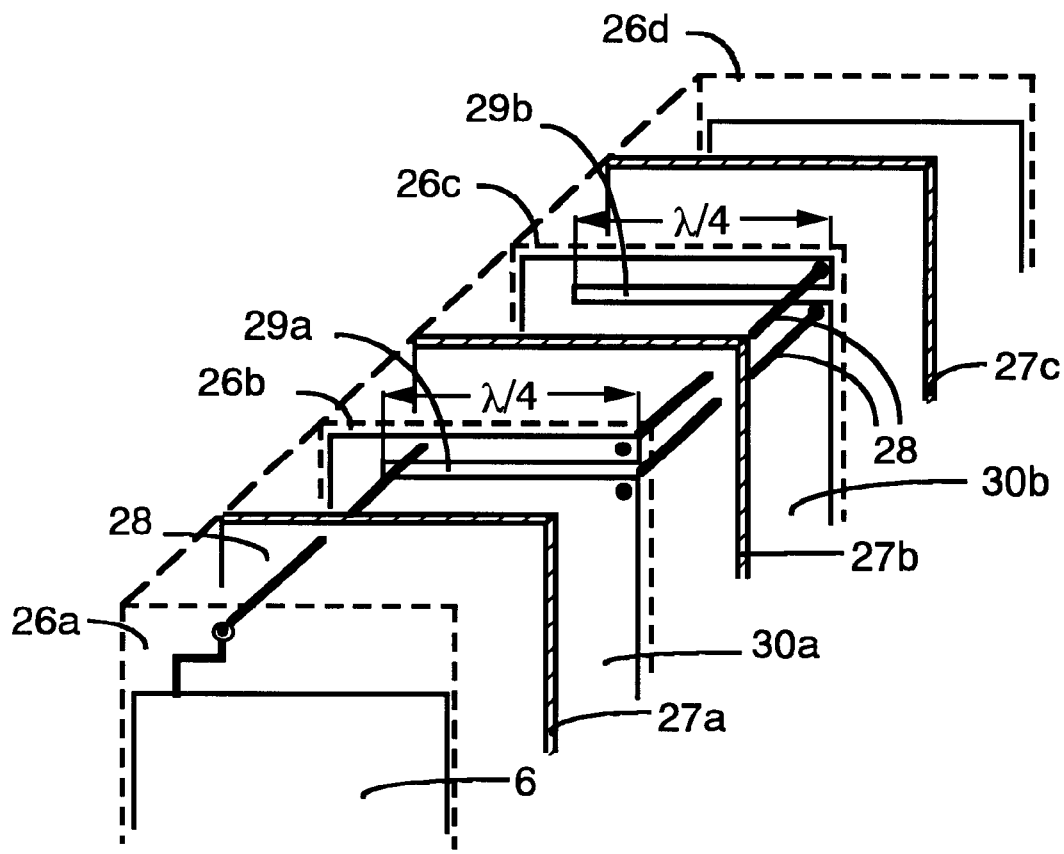
FIG. 6 is a diagram showing each separated layer to show a slot antenna of the third embodiment of the present invention.

FIG. 5 shows a perspective view which illustrates a mobile telecommunication apparatus according to a third embodiment. FIG. 6 shows a plurality of separated layers which comprise a slot antenna 25.

The construction of FIG. 5 is the same as those of the first embodiment of FIG. 1 except for the slot antenna 25. Therefore, the detailed explanation except for the slot antenna 25 is omitted.

In FIG. 6, the printed circuit board 5 is constructed of a multi-layered structure which includes dielectric layers 27a, 27b, and 27c sandwiched between respective copper foil pattern layers 26a, 26b, 26c, and 26d, and a plurality of through-hole platings 28 and earth conductors 30a and 30b which form slots 29a and 29b, respectively. The number of layers is defined by the number of copper foil layers. In FIG. 6, the printed circuit board 5 has four copper foil layers. Therefore, the printed circuit board 5 is referred to as a four layer circuit board. The other construction details are the same as those of the first embodiment, thus, the detailed explanations thereof are omitted.

A slot antenna 25 is equivalent to the λ/2 wavelength slot antenna folded into a U-shape. The slots 29a and 29b are arranged at the top of the earth conductors 30a and 30b, respectively. The electric length of the slots 29a and 29b is about λ/4 wavelengths under the resonance frequency. The width of the slots 29a and 29b is small enough compared to the wavelength. The earth conductors 30a and 30b having slots 29a and 29b, respectively, are shortened via throughhole platings 28. This slot antenna 25 operates as a slot antenna having about λ/2 electric wavelength under the resonance frequency.

Since the slot antenna 25 is formed using the earth conductors 30a and 30b on the printed circuit board 5, large currents flow on the earth conductor 12.

Figure 7:
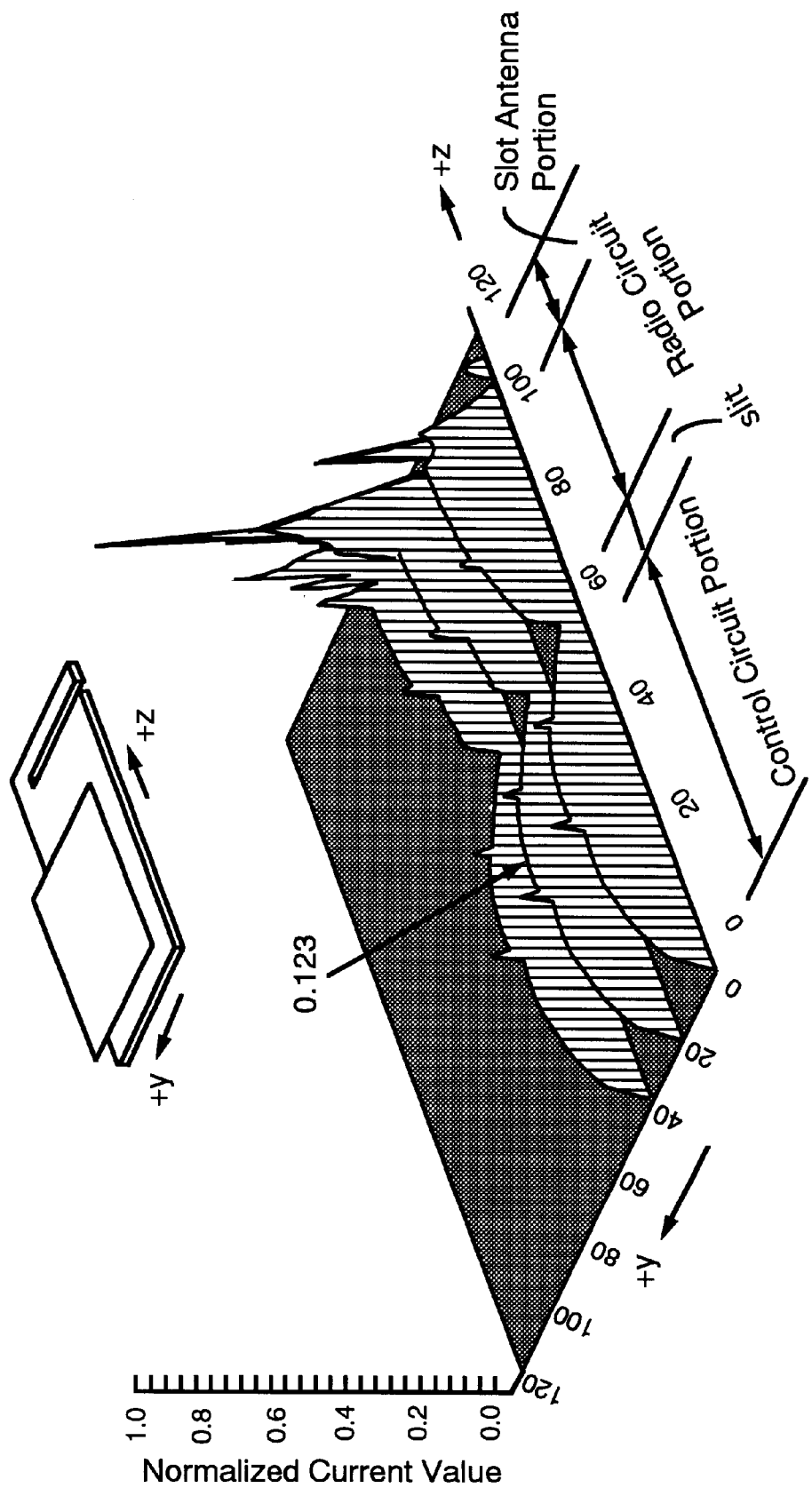
FIG. 7 is a diagram showing calculated values of longitudinal current distribution on the printed circuit board without a slit.
Figure 8:
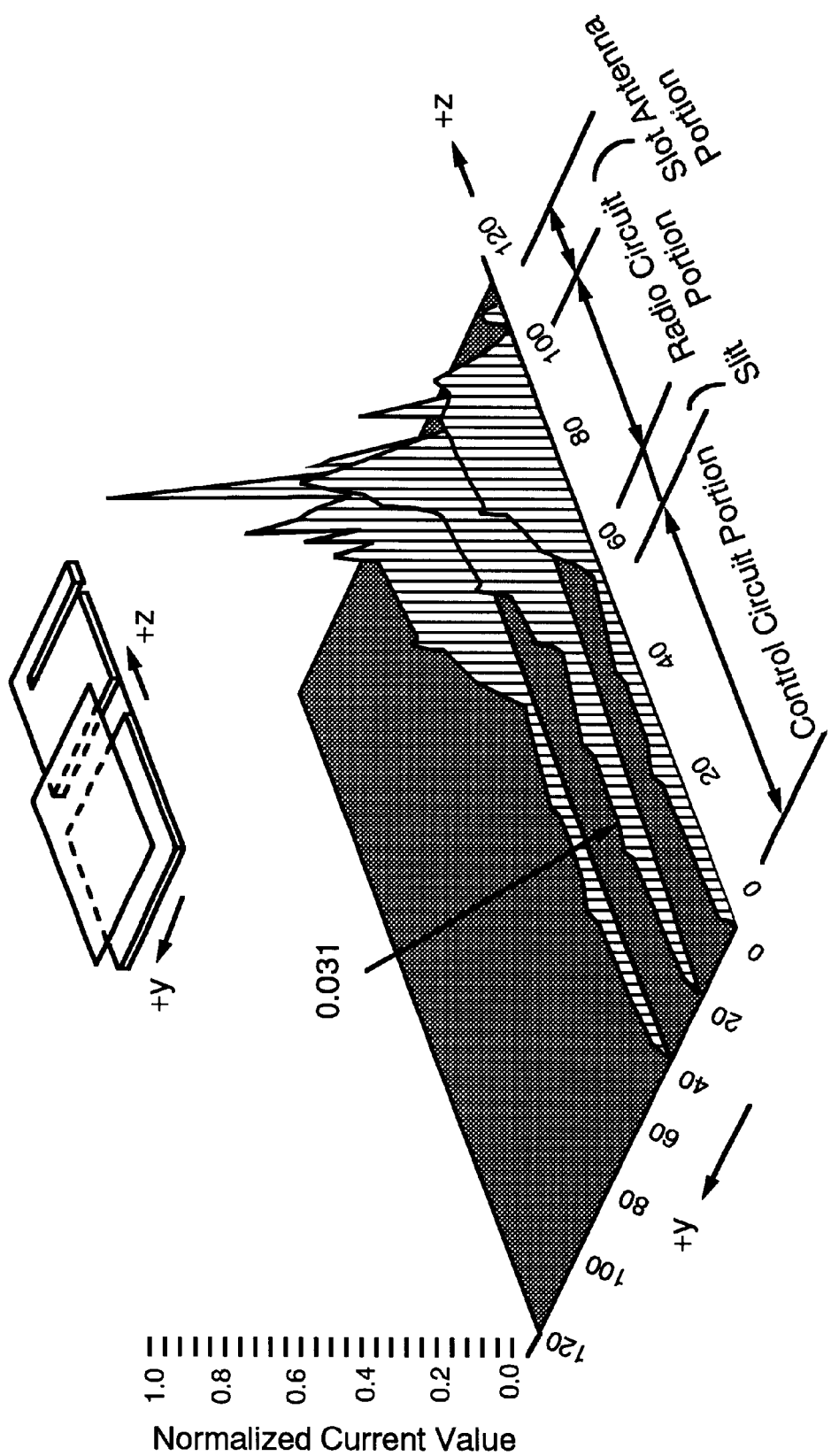
FIG. 8 is a diagram showing calculated values of longitudinal current distribution on the printed circuit board with a slit in the third embodiment of the present invention.

An effect of the slit is explained below. FIG. 7 shows calculated values of longitudinal current distribution on a printed circuit board 5 without a slit 20. FIG. 8 shows calculated values of longitudinal current distribution on a printed circuit board 5 with a slit 20. The vertical direction on the figure shows normalized current values on a printed circuit board 5, which is normalized by a feeder current supplied to the slot antenna 25.

As seen from FIG. 7, the maximum normalized current value is 0.123 around the control circuit 7 on the printed circuit board 5 in case that no slit 20 is provided. Alternatively, the maximum normalized current value is 0.031 around the control circuit 7 on the printed circuit board 5 in case that the slit 20 is provided. In other words, by providing the slit 20 on the printed circuit board 5, the current around the control circuit 7 on a printed circuit board 5 is decreased by about 12 dB.

In the same way as explained in the first embodiment, the current longitudinally flowing on the earth conductor 12 of the printed circuit board 5 is prevented by the slit 20. Therefore, the current path along the slot 20 gets longer and the current flowing through the path along the slot 20 is more attenuated. Also, the current longitudinally flowing along the earth conductor 14 of the printed circuit board 5 is suppressed because of narrower width of the earth conductor 14.

Thus, the parallel plain board mode generated between the control circuit 7 and the battery 15 is suppressed, and the current around the control circuit 7 is reduced.

Furthermore, an effect similar to that obtained for the slot antenna can also be obtained for any other antenna such as an inverted F-type antenna equipped inside of the mobile telecommunication apparatus.

Also, the printed circuit board 5 can be a multi-layered circuit board which includes a single surface circuit board or a double surface circuit board, and the same current decreasing effect can be obtained regardless of the number of layers.

In addition, it is possible to use two circuit boards each of which is separately equipped with the radio circuit 6 and the control circuit 7, respectively, as well as one circuit board commonly equipped with both radio circuit 6 and the control circuit 7 thereon. In each case, the same current decreasing effect can be obtained.

Embodiment 4

Figure 9:
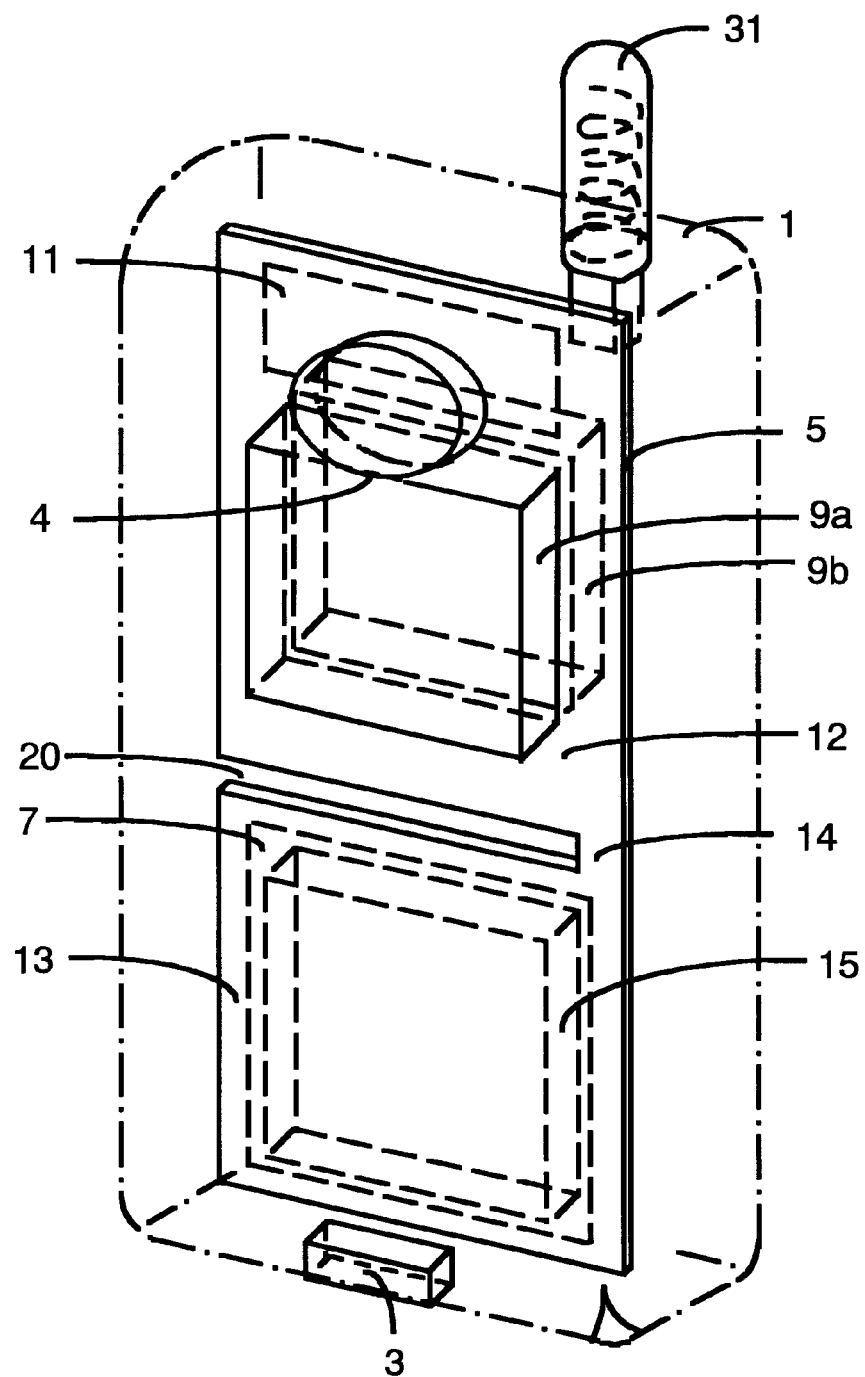
FIG. 9 is a perspective view showing a structural overview of a mobile telecommunication apparatus of the fourth embodiment of the present invention.

FIG. 9 shows a perspective view which illustrates a mobile telecommunication apparatus according to a fourth embodiment. In FIG. 9, the mobile telecommunication apparatus includes a λ/4 wavelength monopole antenna 31.

The λ/4 wavelength monopole antenna 31 preferably consists of a helical type conductor. The impedance characteristic of the λ/4 wavelength monopole antenna is broadband. Also, it is easy to match the impedance with the circuits in the mobile telecommunication apparatus. The other construction details are the same as the construction details of the first embodiment, thus the detailed explanation thereof is omitted.

In the same way as explained in the first embodiment, the current longitudinally flowing on the earth conductor 12 of the printed circuit board 5 is prevented by the slit 20. Therefore, the current path along the slot 20 gets longer and the current flowing along the current path is more attenuated. Also, the current longitudinally flowing along the earth conductor 14 of the printed circuit board 5 is suppressed because of the relatively narrow width of the earth conductor 14.

Thus, the parallel plain board mode generated between the control circuit 7 and the battery 15 is suppressed, and the current around the control circuit 7 is reduced.

Furthermore, an effect similar to that obtained with the λ/4 wavelength monopole antenna can also be obtained for any other antenna such as a straight antenna equipped outside of the mobile telecommunication apparatus.

Also, the printed circuit board 5 can be a multi-layered circuit board which includes a single surface circuit board or a double surface circuit board, and the same current decreasing effect can be obtained regardless of the number of layers.

In addition, it is possible to use two circuit boards each of which is separately equipped with the radio circuit 6 and the control circuit 7, respectively, as well as one circuit board commonly equipped with both radio circuit 6 and the control circuit 7 thereon. In each case, the same current decreasing effect can be obtained.

Embodiment 5

Figure 10:
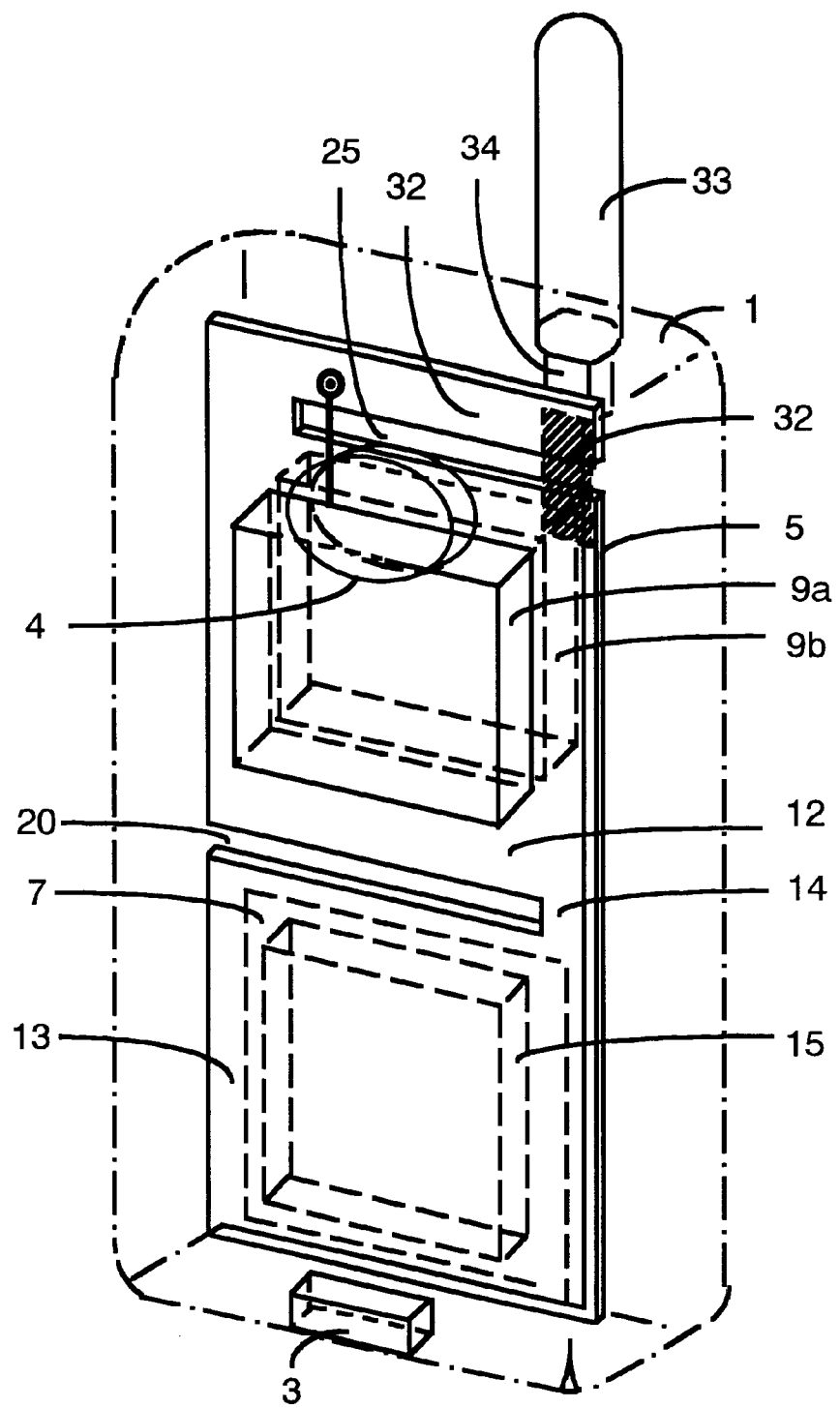
FIG. 10 is a perspective view showing a mobile telecommunication apparatus of a fifth embodiment of the present invention.

FIG. 10 shows a perspective view which illustrates a mobile telecommunication apparatus according to a fifth embodiment. In FIG. 10, the mobile telecommunication apparatus includes a slot terminating portion 32, a λ/2 monopole antenna 33 excited by a slot antenna 25, and an antenna terminating portion 34 of the λ/2 monopole antenna 33. The λ/2 monopole antenna 33, which is fixed to the body 1 of the mobile telecommunication apparatus, is coupled to the slot antenna 25 without contacting the printed circuit board 5.

Figure 11:
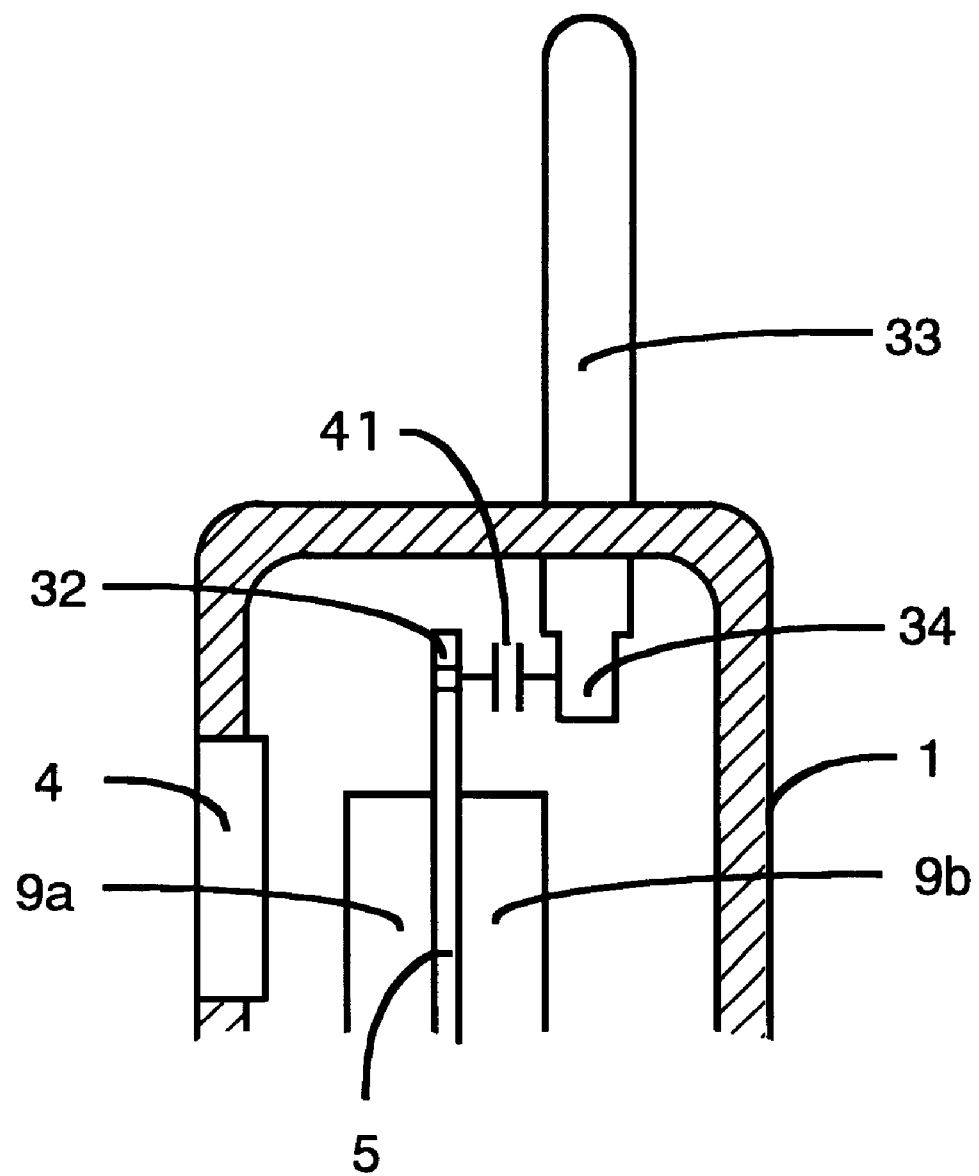
FIG. 11 is a side sectional diagram to explain the operation principle of a mobile telecommunication apparatus of the fifth embodiment of the present invention.

The operation of the λ/2 monopole antenna 33 is explained below. FIG. 11 shows a sectional view of the main portion of the fifth embodiment. In FIG. 11, a slot terminating portion 32 and an antenna terminating portion 34 are placed at a portion where the electrical field is at a maximum. Therefore, the antenna terminating portion 34 of the λ/2 monopole antenna 33 is coupled to the slot terminating portion 32 of the slot antenna 25 via electrical field. The λ/2 monopole antenna 33 is then excited via equivalent capacity 41 between the antenna terminating portion 34 and the slot terminating portion 32. The other construction details are the same as those of the first embodiment, thus the detailed explanation thereof is omitted.

Figure 12:
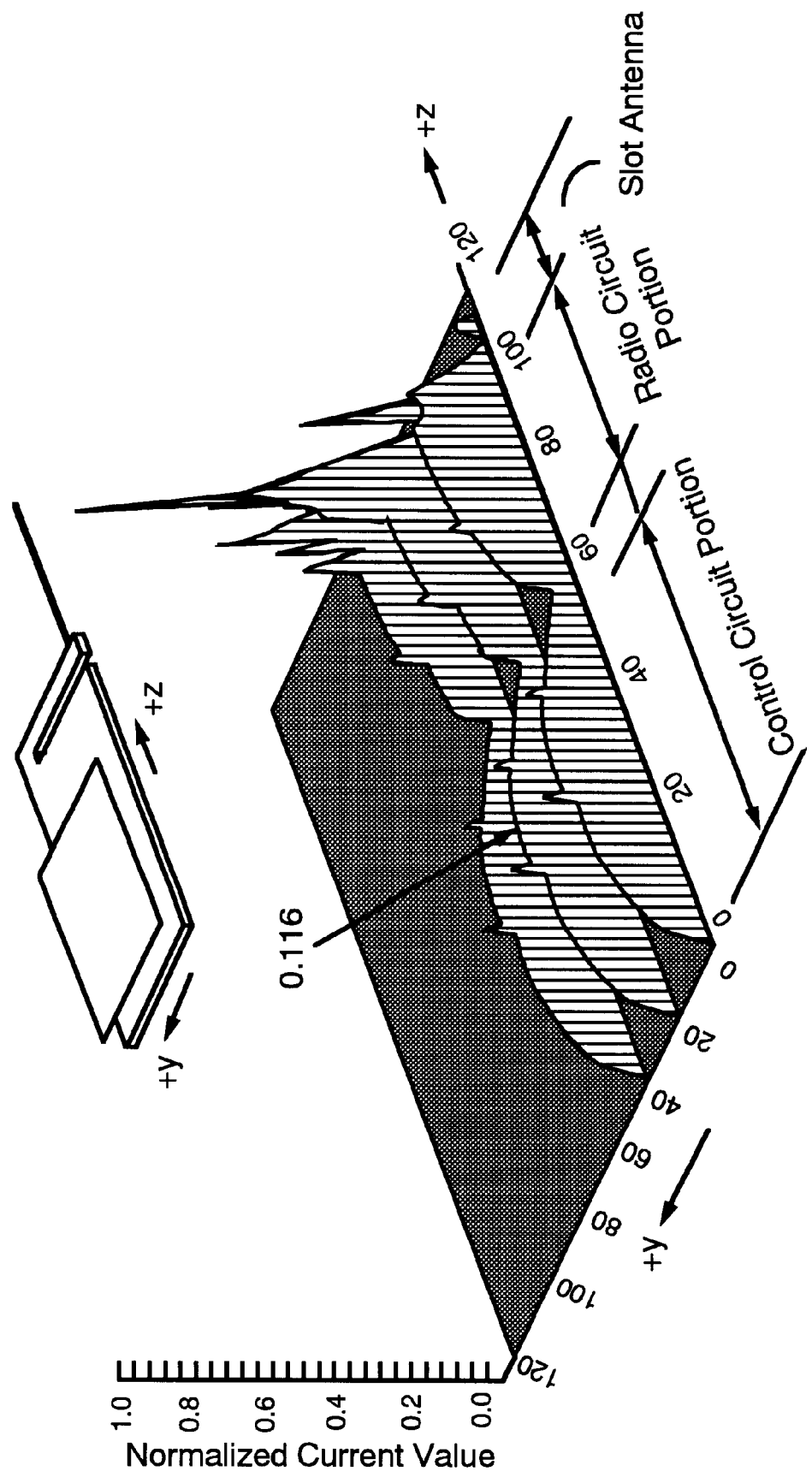
FIG. 12 is a diagram showing calculated values of longitudinal current distribution on a printed circuit board without a slit in a mobile telecommunication apparatus having a non-contact antenna, which excites a λ/2 monopole antenna protruding toward outside of the apparatus body.
Figure 13:
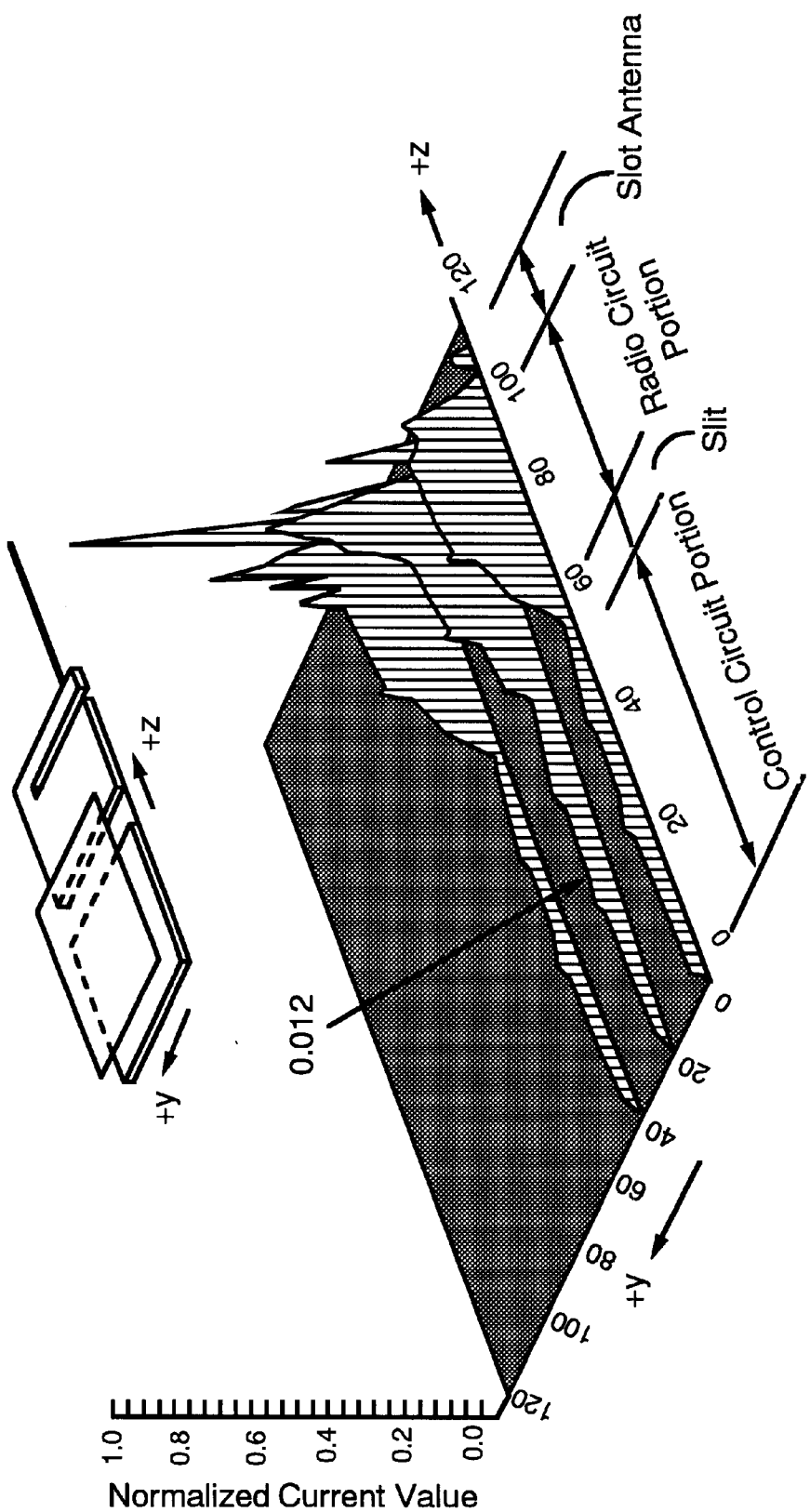
FIG. 13 is a diagram showing calculated values of longitudinal current distribution on a printed circuit board with a slit in a mobile communication of the fifth embodiment of the present invention.

FIG. 12 illustrates a slot antenna 25 which excites the λ/2 monopole antenna 33 equipped at the outside of the apparatus body without contacting the λ/2 monopole antenna. FIG. 12 shows calculated values of longitudinal current distribution on the printed circuit board 5 without a slit 20. FIG. 13 shows calculated values of longitudinal current distribution on the printed circuit board 5 with a slit 20 in the mobile telecommunication apparatus according to the fifth embodiment of the present invention.

As seen from FIG. 12 and FIG. 13, the maximum normalized current value is 0.116 around the control circuit 7 on the printed circuit board 5 in case that no slit 20 is provided, but the maximum normalized current value is 0.012 around the control circuit 7 on the printed circuit board 5 in case that the slit 20 is provided. In other words, by providing the slit 20 on the printed circuit board 5, the current around the control circuit 7 on the printed circuit board 5 is decreased down to about 20 dB.

In the same way as explained in the first embodiment, the current longitudinally flowing on the earth conductor 12 of the printed circuit board 5 is prevented by the slit 20. Therefore, the current path along the slot 20 gets longer and the current flowing through the path along the slot 20 is more attenuated. Also, the current longitudinally flowing along the earth conductor 14 of the printed circuit board 5 is suppressed because of the relatively narrow width of the earth conductor 14.

Thus, the parallel plain board mode generated between the control circuit 7 and the battery 15 is suppressed, and the current around the control circuit 7 is reduced.

Furthermore, an effect similar to that obtained with the λ/2 monopole antenna can also be obtained for any other antenna such as an inverted F-type antenna equipped inside of the mobile telecommunication apparatus or a helical antenna equipped outside of the mobile telecommunication apparatus.

Also, the printed circuit board 5 can be a multi-layered circuit board which includes a single surface circuit board or a double surface circuit board, and the same current decreasing effect can be obtained regardless of the number of layers.

In addition, it is possible to use two circuit boards each of which is separately equipped with the radio circuit 6 and the control circuit 7, respectively, as well as one circuit board commonly equipped with both radio circuit 6 and the control circuit 7 thereon. In each case, the same current decreasing effect can be obtained.

Embodiment 6

Figure 14:
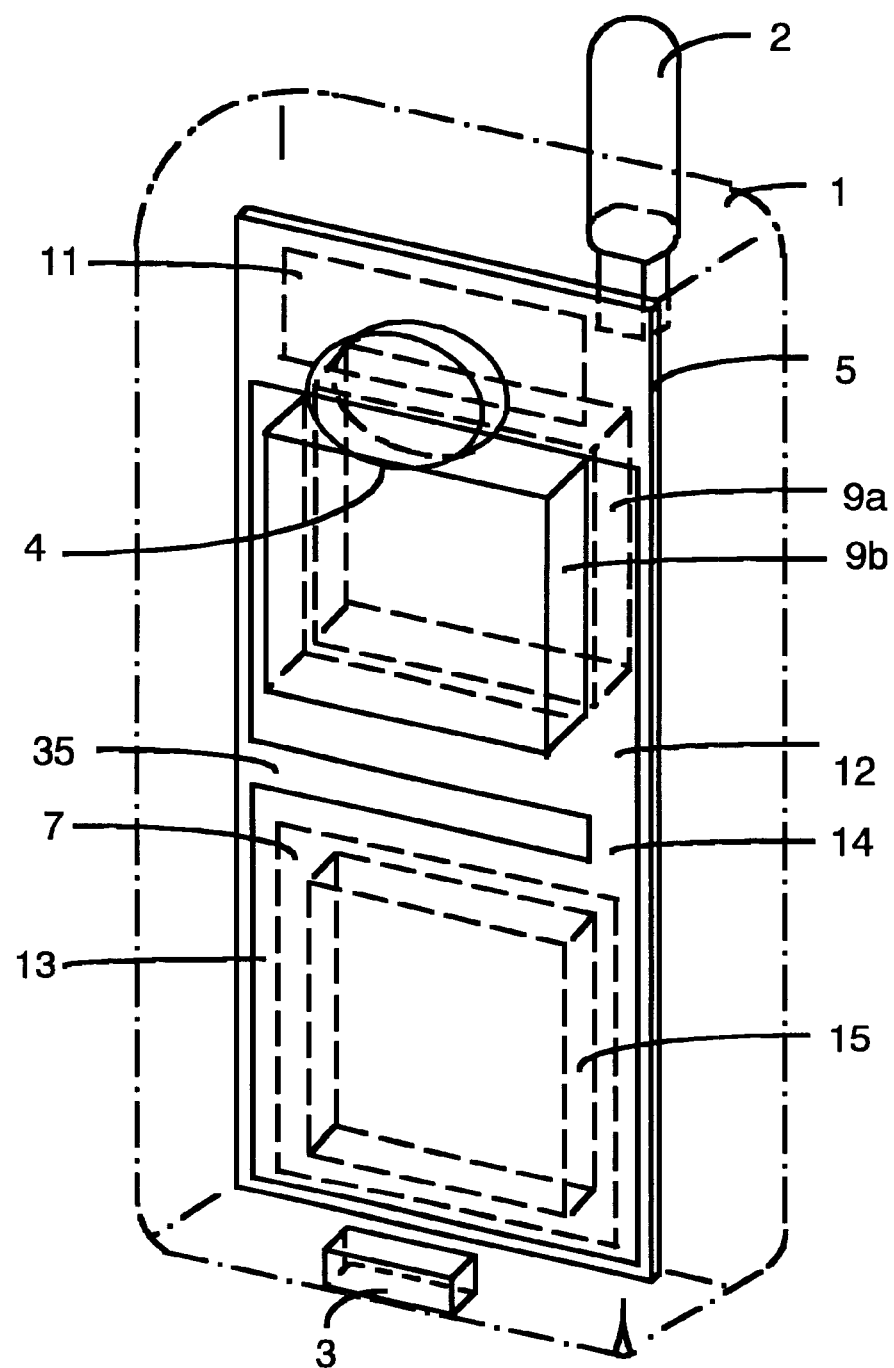
FIG. 14 is a perspective view showing a mobile telecommunication apparatus of a sixth embodiment of the present invention.
Figure 15:
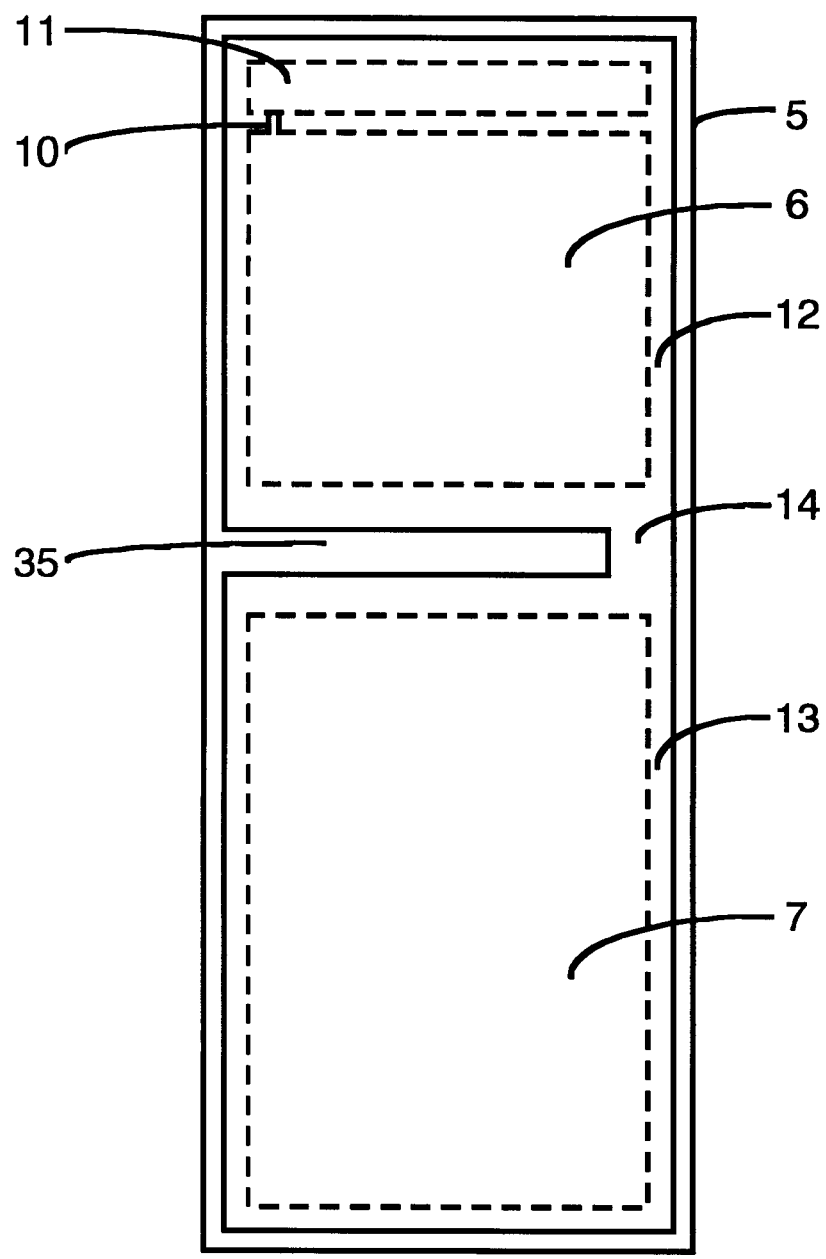
FIG. 15 is a front view showing a printed circuit board equipped in a mobile telecommunication apparatus of the sixth embodiment of the present invention.

FIG. 14 shows a perspective view which illustrates a mobile telecommunication apparatus according to a sixth embodiment. FIG. 15 shows a front view of a printed circuit board 5 equipped in the mobile telecommunication apparatus of the sixth embodiment of the present invention. In FIG. 14, the mobile telecommunication apparatus include a slit 35 which is constructed on the printed circuit board 5 between the radio circuit 6 and the control circuit 7 by etching a copper foil pattern layer.

The construction of the present embodiment makes it easier to define the slit 35 on the printed circuit board 5 between the radio circuit 6 and the control circuit 7, and has advantages such as a large strength, compared to the machining process that defines the slot as shown above. The other construction details are the same as those of the first embodiment, thus the detailed explanation thereof is omitted.

In the same way as explained in the first embodiment, the current longitudinally flowing on the earth conductor 12 of the printed circuit board 5 is prevented by the slit 20 which is constructed by etching processing of the copper foil pattern layer. Therefore, the current path along the slot 20 gets longer and the current flowing through the path along the slot 20 is more attenuated. Also, the current longitudinally flowing along the earth conductor 14 of the printed circuit board 5 is suppressed because of the relatively narrow width of the earth conductor 14.

Thus, the parallel plain board mode generated between the control circuit 7 and the battery 15 is suppressed, and the current around the control circuit 7 is reduced. That is, the current amplitude which distributes along the control circuit 7 is reduced.

Furthermore, an effect similar to that obtained with the straight slot can also be obtained with any other slit shape such as a curved slit.

In addition, an effect similar to that obtained with the monopole antenna is also obtained for any type of antennas.

Also, the printed circuit board 5 can be a multi-layered circuit board which includes a single surface circuit board or a double surface circuit board, and the same current decreasing effect can be obtained regardless of the number of layers.

In addition, it is possible to use two circuit boards each of which is separately equipped with the radio circuit 6 and the control circuit 7, respectively, as well as one circuit board commonly equipped with both radio circuit 6 and the control circuit 7 thereon. In each case, the same current decreasing effect can be obtained.

Embodiment 7

Figure 16:
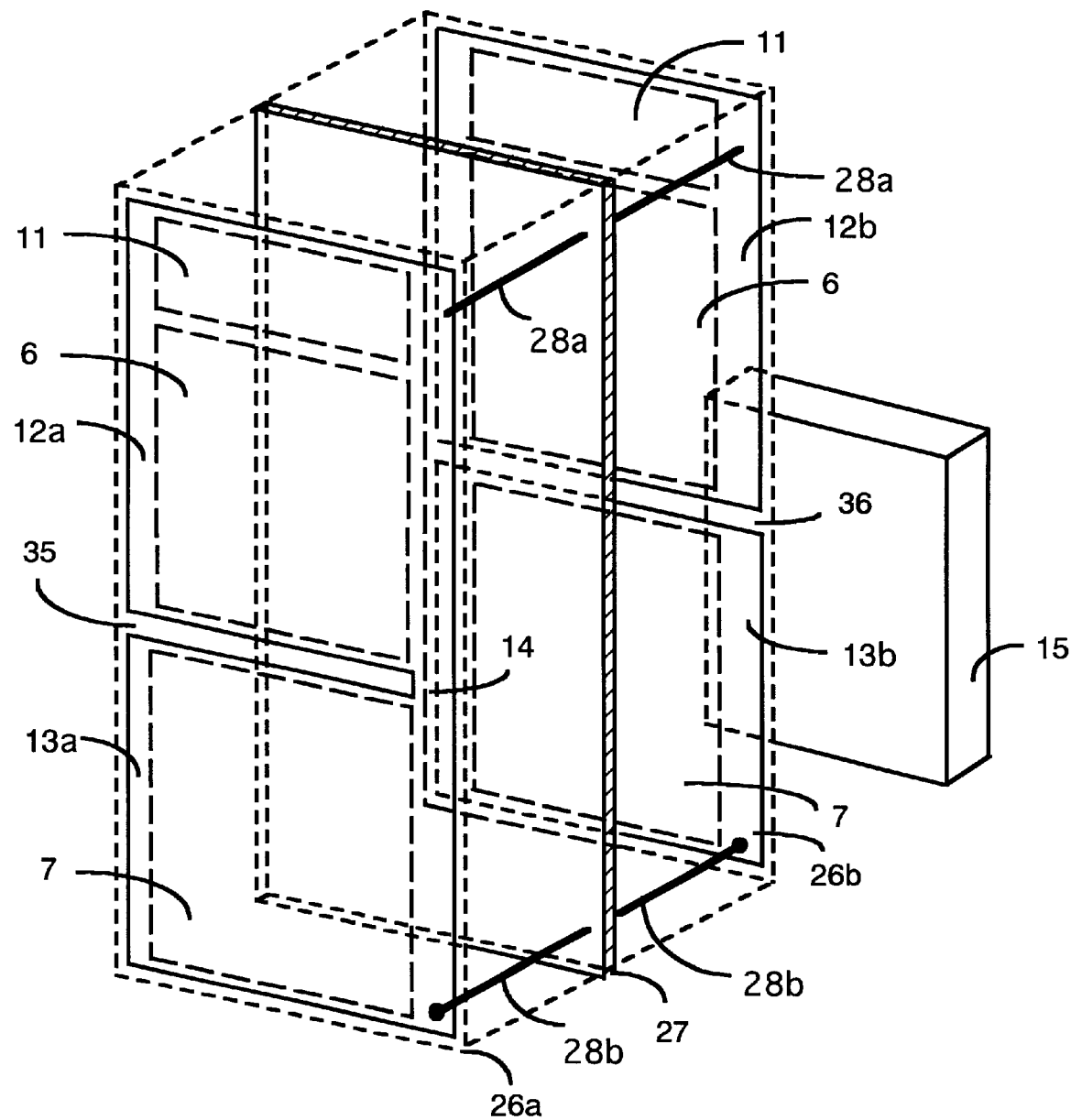
FIG. 16 is a diagram showing a locational relationship between a printed circuit board and a battery which are included in a mobile telecommunication apparatus of the seventh embodiment of the present invention.

FIG. 16 shows locational relationship between a printed circuit board 5 and a battery 15 according to a seventh embodiment. In FIG. 16, the printed circuit board 5 is constructed with copper foil pattern layers 26a and 26b, and a dielectric layer 27. On the copper foil pattern layers 26a, the earth conductors 12a and 13a form a slot 35 where narrow portion 14 connects the earth conductors 12a and 13a. Alternatively, on the copper foil pattern layers 26b, the earth conductors 12b and 13b form a slot 36 which separates the earth conductors 12b and 13b without forming the narrow portion 14.

In addition, in FIG. 16, the earth conductor 12a on the copper foil pattern layer 26a and the earth conductor 12b on the copper foil pattern layer 26b are connected via through-hole plating 28a. Similarly, the earth conductor 13a on the copper foil pattern layer 26a and the earth conductor 13b on the copper foil pattern layer 26b are connected via through-hole plating 28b.

The slit 35 is formed on the opposite surface of the printed circuit board 5 from the battery 15. The slit 35 is formed by etching a copper foil pattern layer between the radio circuit 6 and the control circuit 7.

The slit 36 is formed on the surface of the printed circuit board 5 facing the battery 15 and separates the earth conductor 12a from the earth conductor 13a.

The surface of the printed circuit board 5 facing the battery 15 generates less parallel board mode because the earth conductor 12b and an earth conductor 13b are separated. Alternatively, on the surface of the printed circuit board 5 opposite to the battery 15, the current flowing longitudinally on a printed circuit board 5 is suppressed, and the parallel board mode is not generated because it is not facing the battery. Therefore, the parallel board mode is suppressed between the battery 15 and the control circuit 7, and the current around the control circuit 7 on a printed circuit board 5 can be further reduced.

Furthermore, an effect similar to that obtained with the straight slot can be obtained with any other slit shape such as a curved slit.

In addition, an effect similar to that obtained with the monopole antenna is obtained with any type of antennas.

Also, the printed circuit board 5 can be a multi-layered circuit board which includes a single surface circuit board or a double surface circuit board, and the same current decreasing effect can be obtained regardless of the number of layers.

In addition, it is possible to use two circuit boards each of which is separately equipped with the radio circuit 6 and the control circuit 7, respectively, as well as one circuit board commonly equipped with both radio circuit 6 and the control circuit 7 thereon. In each case, the same current decreasing effect can be obtained.

Embodiment 8

Figure 17:
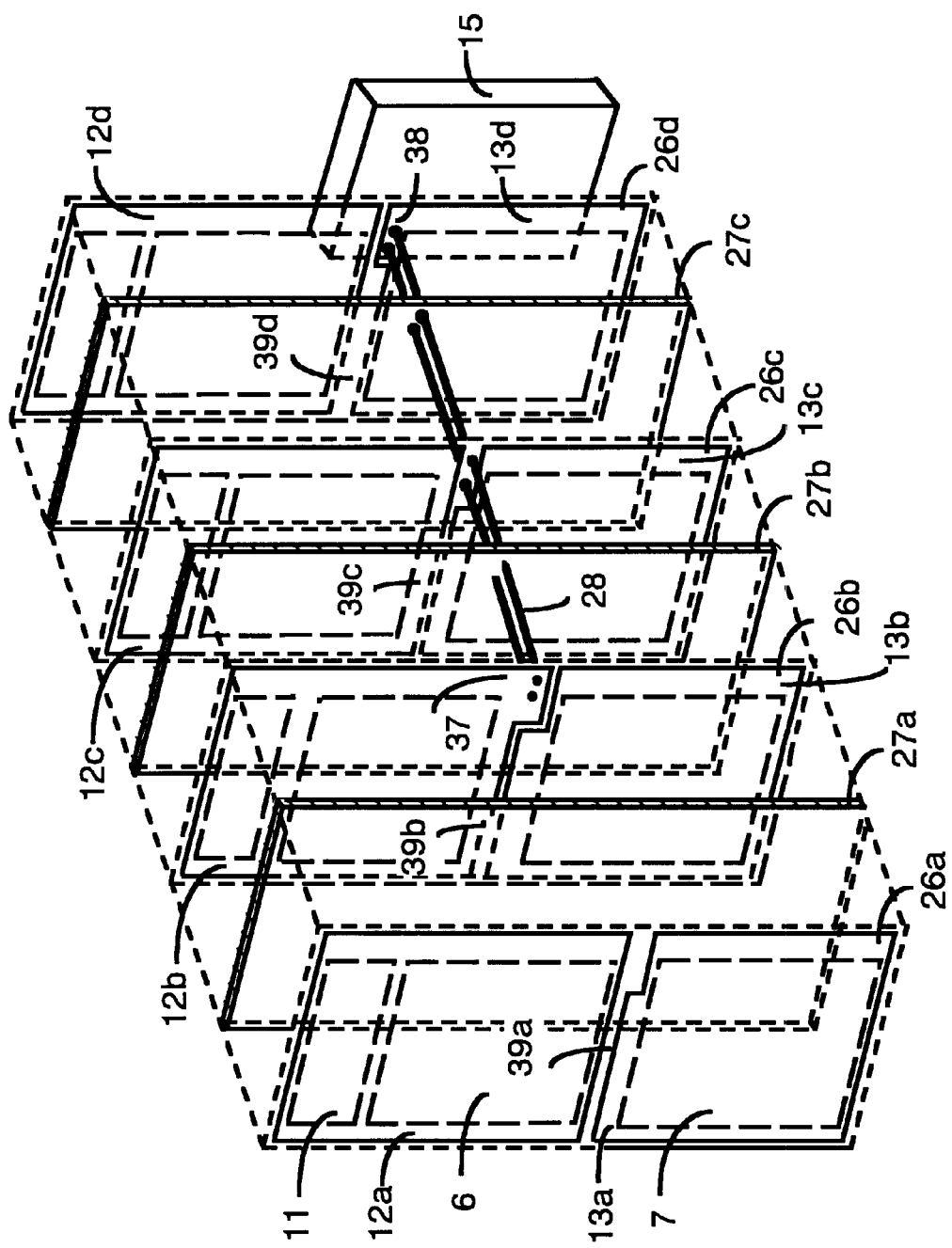
FIG. 17 is a diagram showing a locational relationship between a printed circuit board and a battery which are included in a mobile telecommunication apparatus of an eighth embodiment of the present invention.
Figure 18:
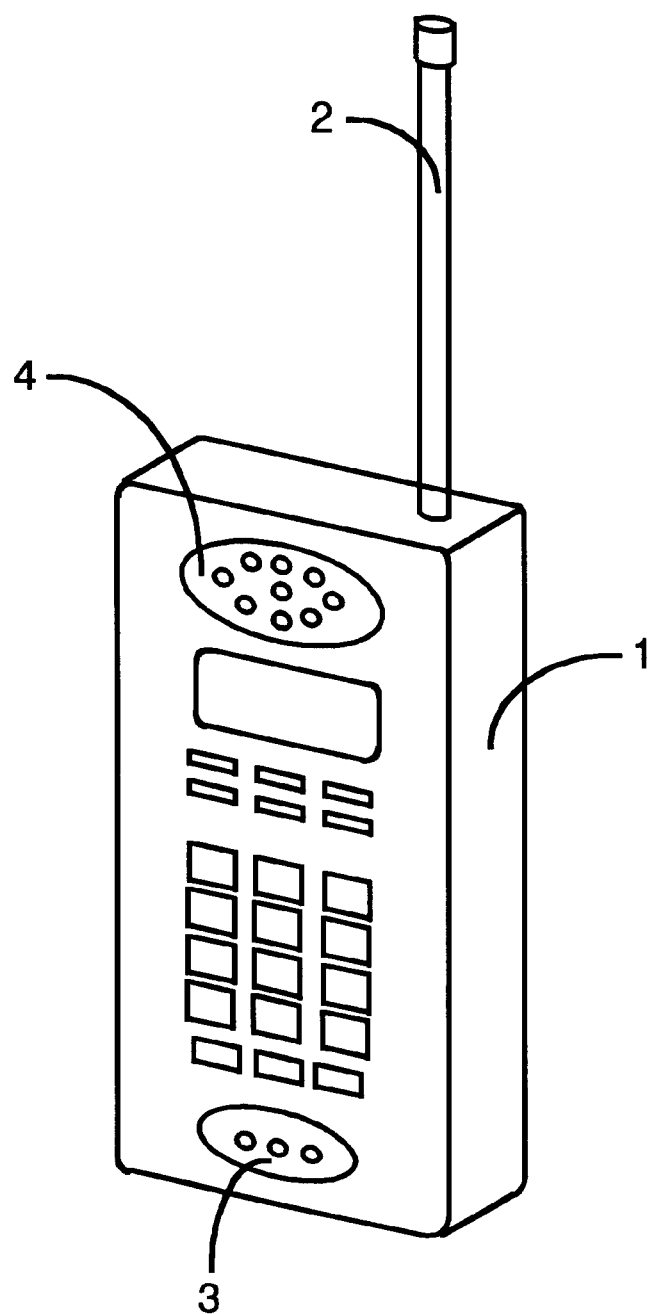
FIG. 18 illustrates a conventional mobile telecommunication apparatus.
Figure 19:
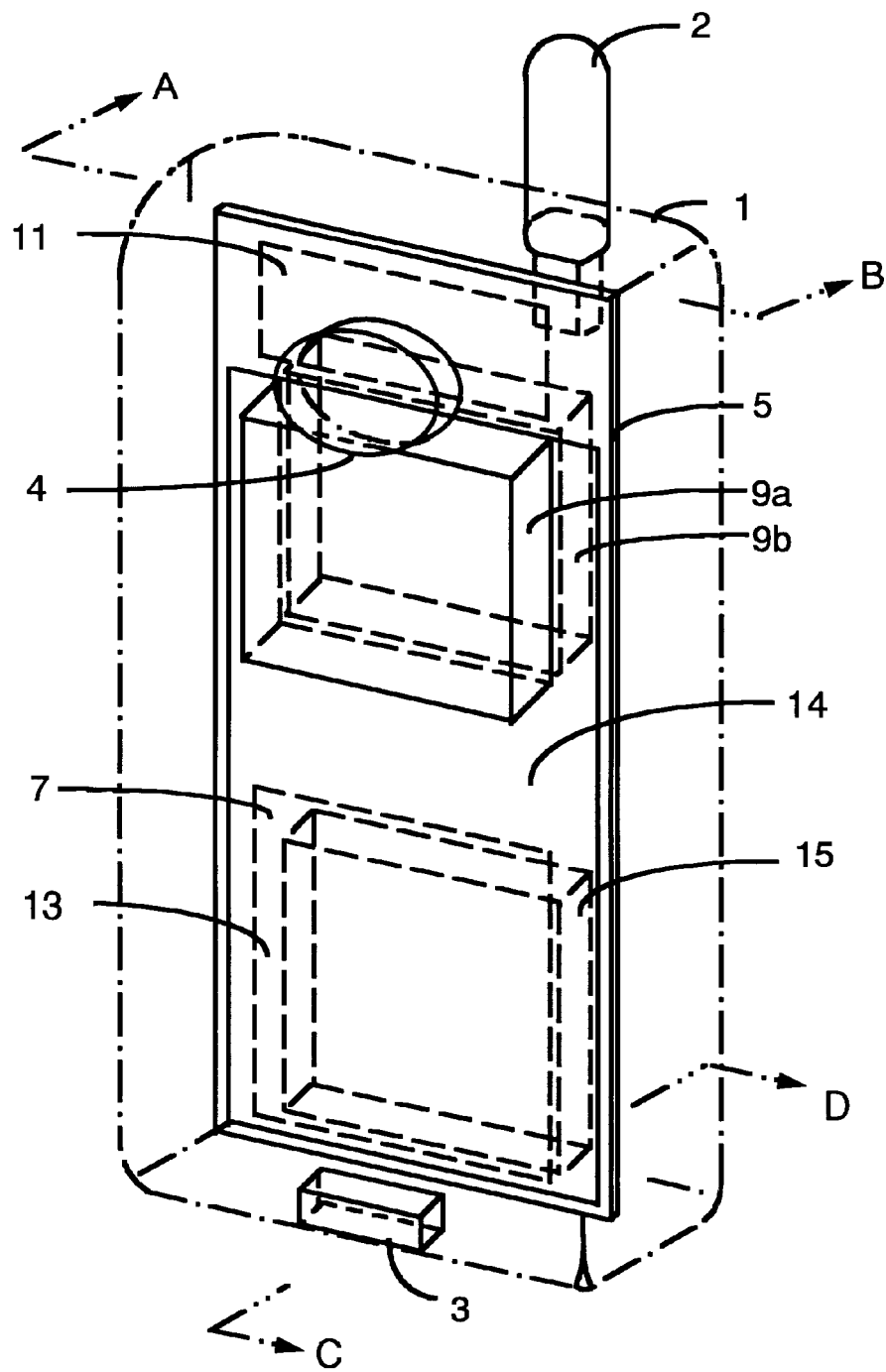
FIG. 19 is a perspective view which illustrates an internal construction of a conventional mobile telecommunication apparatus.
Figure 20:
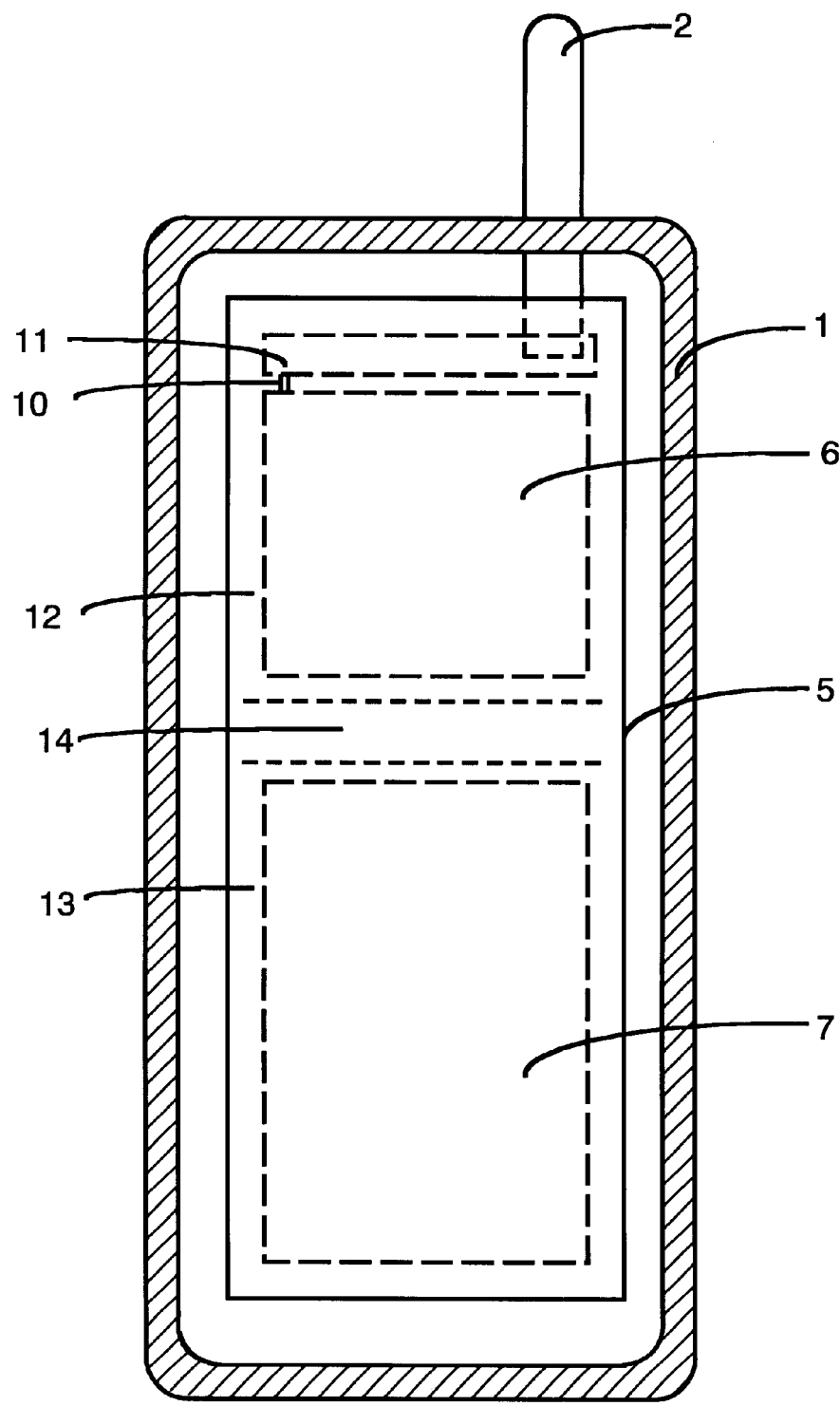
FIG. 20 and FIG. 21 are sectional views seen from a line A–B and a line C–D in FIG. 19, respectively.
Figure 21:
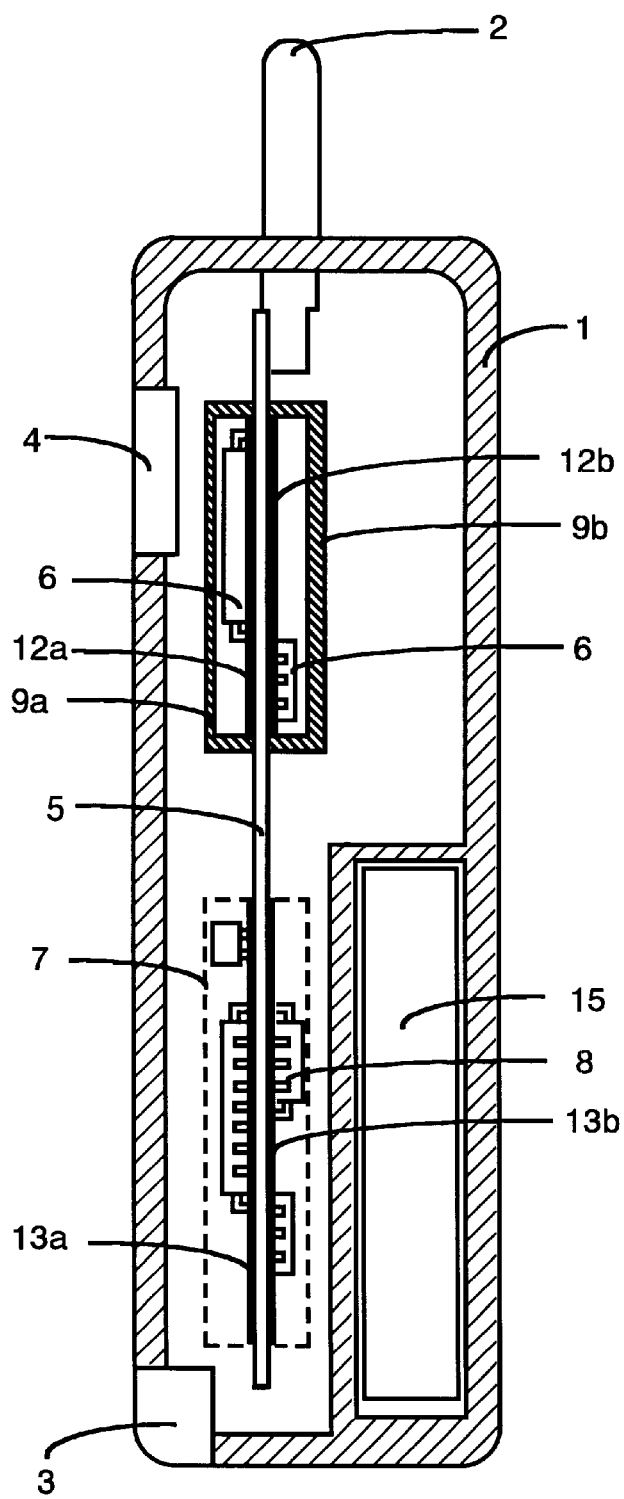

FIG. 17 shows the locational relationship between a printed circuit board 5 and the battery 15 according to an eighth embodiment. In FIG. 17, the printed circuit board 5 is constructed with four layers. They are a first copper foil pattern layer 26a, a second copper foil pattern layer 26b, a third copper foil pattern layer 26c, and fourth copper foil pattern layer 26d, respectively, which are arranged in the order of farthest from the battery 15. The dielectric layers 27a, 27b, and 27c are sandwiched by the first copper foil pattern layer 26a, the second copper foil pattern layer 26b, the third copper foil pattern layer 26c, and the fourth copper foil pattern layer 26d, respectively. A copper foil pattern 37 is arranged on the earth conductor 12b on the second copper foil pattern layer 26b, and a copper foil pattern 38 is arranged on the earth conductor 13d on the fourth copper foil pattern layer 26d. The copper foil pattern 37 and the copper foil pattern 38 are connected by the through-hole plating 28 through the dielectric layer 27b, the third copper foil pattern layer 26c and the dielectric layer 27c. Then the earth conductor 12b and the earth conductor 13d are connected electrically. The slits 39a, 39b, 39c and 39d separate the earth conductor 12a~d from the earth conductor 13a~d, respectively, on the copper foil pattern layers 26a, 26b, 26c and 26d, respectively.

FIG. 17 shows a connection example between the earth conductors 12b on the second copper foil pattern layer 26b and the earth conductors 13d on the fourth copper foil pattern layer 26d. The inter-layer connection copper foil pattern 37 is formed on the second copper foil pattern layer 26b, and the inter-layer connection copper foil pattern 38 for is formed on the fourth copper foil pattern layer 26d. However, if the earth conductors are connected with the other copper foil pattern layers, any inter-layer connection copper foil patterns can be arranged on any earth conductors unless the inter-layer connection copper foil pattern 37 and the inter-layer connection copper foil pattern 38 are not arranged on the same layer.

The earth conductor 12 of the radio circuit 6 or the earth conductor 13 of the control circuit are also connected via the through-hole plating 28, but they are not illustrated from the view point of the simple figure construction.

The earth conductors on the second first copper foil pattern layer 26b and the third copper foil pattern layer 26c are separated by the slits 39b and 39c, respectively, which separate the current flowing through the radio circuit 6 and the control circuit 7.

At the first copper foil pattern layer 26a and the fourth copper foil pattern layer 26d, that is, at the surface layers of the printed circuit board 5, the parallel board mode is greatly reduced, because the earth conductors 12a,d and the earth conductors 13a,d are separated via the slits 39a and 39d, respectively.

Therefore, the parallel board mode is suppressed between the battery 15 and the control circuit 7, and the current around the control circuit 7 on a printed circuit board 5 can be further reduced.

In FIG. 17, the current flowing longitudinally on the printed circuit board 5 can be still further suppressed even in the second copper foil pattern layer 26b and the third copper foil pattern layer 26c which are inner surface layer of the printed circuit board 5. This is because the earth conductors 12b,c and the earth conductors 13b,c are separated via the slits 39b and 39c, respectively.

Furthermore, an effect similar to that obtained with the straight slot can also be obtained with any other slit shapes such as a curved slit.

In addition, an effect similar to that obtained with the monopole antenna is obtained for any types of antennas.

Also, the printed circuit board 5 can be a multi-layered circuit board which includes a single surface circuit board or a double surface circuit board, and the same current decreasing effect can be obtained regardless of the number of layers.

In addition, it is possible to use two circuit boards each of which is separately equipped with the radio circuit 6 and the control circuit 7, respectively, as well as one circuit board commonly equipped with both radio circuit 6 and the control circuit 7 thereon. In each case, the same current decreasing effect can be obtained.

In case of the two circuit board construction such as shown in FIG. 3, the earth conductor 12 on the first printed circuit board and the earth conductor 13 on the second printed circuit board are connected to each other via a through-hole.

As described above, according to the eighth embodiment of the present invention, the current can be reduced around the control circuit 7 by forming the slits 39a, 39b, 39c and 39d between the earth conductors 12a,b,c and d and the earth conductors 13a,b,c and d, respectively.

Since the current around a control circuit portion 7 is reduced, the influence for audio circuit in the control circuit 7 can be lowered, and audio noises can be reduced.

Since the currents flowing on the earth conductors 13a,b,c and d of the control circuit on the printed circuit board 5 are reduced, the inverted-phase current acting against the antenna current is decreased. Therefore, the horizontal gain for the body of the mobile telecommunication apparatus is improved, an improved radiation pattern is obtained, and the transmission/reception range thereby increased.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A mobile telecommunication apparatus comprising:
    a printed circuit board located in a body of the mobile telecommunication apparatus;
    a radio circuit including a modulator circuit and a demodulator circuit arranged on the printed circuit board;
    a control circuit including a voice circuit for processing a voice signal arranged on the printed circuit board;
    a first earth conductor for grounding the radio circuit;
    a second earth conductor for grounding the control circuit and being continuous with the first earth conductor; and
    an antenna being connected to the radio circuit,
    said printed circuit board having a slit arranged between the first earth conductor and the second earth conductor.

2. The mobile telecommunication apparatus according to claim 1, wherein said antenna is included in the body of the mobile telecommunication apparatus.

3. The mobile telecommunication apparatus according to claim 2, wherein said antenna is a $\lambda/2$ wavelength slot inner antenna constructed with a $\lambda/4$ wavelength slot arranged at one portion of the printed circuit board.

4. The mobile telecommunication apparatus according to claim 1, wherein said antenna is a $\lambda/4$ wavelength monopole antenna protruding toward outside of the body of the mobile telecommunication apparatus.

5. The mobile telecommunication apparatus according to claim 1, further comprising an outside antenna including a $\lambda/2$ monopole antenna protruding toward outside of the body of the mobile telecommunication apparatus, said outside antenna being excited by the inner antenna by way of non-contact feeding.

6. The mobile telecommunication apparatus according to claim 1, wherein said slit is formed by a pattern etching process on the printed circuit board.

7. The mobile telecommunication apparatus to claim 1, wherein the slit is located in the printed circuit board.

8. The mobile telecommunication apparatus according to claim 7, wherein the slit extends only in a portion of the printed circuit, so that the current from the first earth conductor flows along the slot to the second earth conductor.

9. A mobile telecommunication apparatus comprising:
a first printed circuit board located in the mobile telecommunication apparatus;
a second printed circuit board located in the mobile telecommunication apparatus;
a radio circuit including a modulator circuit and a demodulator circuit arranged on the first printed circuit board;
a control circuit including a voice circuit for processing a voice signal arranged on the second printed circuit board;
a first earth conductor for grounding the radio circuit on the first printed circuit board;
a second earth conductor for grounding the control circuit on the second printed circuit board;
a third earth conductor on the second printed circuit board being electrically connected with the second earth conductor;
a connector for connecting the first earth conductor with the third earth conductor; and
an antenna connected to the radio circuit,
said second printed circuit board having a slit arranged between the second earth conductor and the third earth conductor.

10. The mobile telecommunication apparatus according to claim 9, wherein said antenna is included in a body of the mobile telecommunication apparatus.

11. The mobile telecommunication apparatus according to claim 10, wherein said antenna is a $\lambda/2$ wavelength slot inner antenna constructed with a $\lambda/4$ wavelength slot arranged at one portion of the printed circuit board.

12. The mobile telecommunication apparatus according to claim 9, wherein said antenna is a $\lambda/4$ wavelength monopole antenna protruding toward outside of the body of the mobile telecommunication apparatus.

13. The mobile telecommunication apparatus according to claim 9, wherein said antenna excites a $\lambda/2$ monopole antenna protruding toward outside of the apparatus body by way of non-contact feeding.

14. The mobile telecommunication apparatus according to claim 9, wherein said slit is formed by a pattern etching process on the first and second printed circuit boards.

15. A mobile telecommunication apparatus comprising:
a printed circuit board located in a body of the mobile telecommunication apparatus;
a radio circuit including a modulator circuit and a demodulator circuit arranged on the printed circuit board;
a control circuit including a voice circuit for processing a voice signal arranged on the printed circuit board;
a first earth conductor formed on a first surface of the printed circuit board for grounding the radio circuit;
a second earth conductor formed on a second surface of the printed circuit board for grounding the control circuit;
a third earth conductor located on the second surface of the printed circuit board at a corresponding location facing the first earth conductor and being electrically connected with the second earth conductor;
a fourth earth conductor located on the first surface of the printed circuit board at a corresponding location facing the second earth conductor;
a battery facing the fourth earth conductor; and
an antenna connected to the radio circuit,
said printed circuit board having:
a first slit for electrically separating the first earth conductor and the fourth earth conductor; and
a second slit arranged between the second earth conductor and the third earth conductor.

16. The mobile telecommunication apparatus according to claim 15, wherein said antenna is included in the body of the mobile telecommunication apparatus.

17. The mobile telecommunication apparatus according to claim 16, wherein said antenna is a $\lambda/2$ wavelength slot inner antenna constructed by $\lambda/4$ wavelength slot arranged at one portion of the printed circuit board.

18. The mobile telecommunication apparatus according to claim 15, wherein said antenna is a $\lambda/4$ wavelength monopole antenna protruding toward outside of the apparatus body.

19. The mobile telecommunication apparatus according to claim 15, further comprising an outside antenna including a $\lambda/2$ monopole antenna protruding toward outside of the apparatus body which is excited by the inner antenna by way of non-contact feeding.

20. The mobile telecommunication apparatus according to claim 15, wherein said slit is constructed by a pattern etching process on the printed circuit board.

21. A mobile telecommunication apparatus comprising:
a printed circuit board equipped in a body of the mobile telecommunication apparatus;
a radio circuit including a modulator circuit and a demodulator circuit arranged on the printed circuit board;
a control circuit including a voice circuit for processing a voice signal arranged on the printed circuit board;
a first earth conductor formed on a first surface of the printed circuit board for grounding the radio circuit;
a second earth conductor formed on a second surface of the printed circuit board for grounding the control circuit;
a third earth conductor located on the second surface of the printed circuit board at a corresponding location facing the first earth conductor for grounding the radio circuit;
a fourth earth conductor located on the first surface of the printed circuit board at a corresponding location facing the second earth conductor for grounding the control circuit;
a battery facing the fourth earth conductor; and
an antenna connected to the radio circuit,
said printed circuit board having:
a first slit for electrically separating the first earth conductor and the fourth earth conductor; and
a second slit for electrically separating the second earth conductor and the third earth conductor.

22. A mobile telecommunication apparatus comprising:
a multi layered printed circuit board located in a body of the mobile telecommunication apparatus, the multi layer including a plurality of earth conductors and dielectric boards interleaved between the earth conductors;

at least one first earth conductor on a surface of at least one of the plurality of dielectric boards for grounding a radio circuit and at least one second earth conductor on the surface of the at least one of the plurality of dielectric boards for grounding a control circuit, said at least one of the plurality of dielectric boards having a slit for electrically separating the first earth conductor and the second earth conductor; and a battery facing the at least one second earth conductor, wherein the first earth conductor on any surface of the dielectric boards is connected by through-hole plating to the second earth conductor on another surface of the dielectric boards through another of the earth conductors and another of the dielectric boards.

23. The mobile telecommunication apparatus according to claim 22, wherein the slit is in the multi-layered printed circuit board.

* * * * *